US011150292B1

(12) United States Patent
Variyam et al.

(10) Patent No.: US 11,150,292 B1
(45) Date of Patent: Oct. 19, 2021

(54) VOLTAGE SPIKE DETECTOR AND SYSTEM FOR DETECTING VOLTAGE SPIKES IN SEMICONDUCTOR DEVICES

(71) Applicant: Anora, LLC, Richardson, TX (US)

(72) Inventors: Pramodchandran Variyam, Plano, TX (US); Sasikumar P. Cherubal, Frisco, TX (US)

(73) Assignee: Anora, LLC, Richardson, TX (US)

( * ) Notice: Subject to any disclaimer, the term of this patent is extended or adjusted under 35 U.S.C. 154(b) by 98 days.

(21) Appl. No.: 16/457,919

(22) Filed: Jun. 28, 2019

(51) Int. Cl.
| | |
|---|---|
| *G01R 31/26* | (2020.01) |
| *G01R 31/319* | (2006.01) |
| *H03M 1/12* | (2006.01) |
| *G01R 19/10* | (2006.01) |
| *G01R 31/3193* | (2006.01) |

(52) U.S. Cl.
CPC ......... *G01R 31/2607* (2013.01); *G01R 19/10* (2013.01); *G01R 31/31922* (2013.01); *G01R 31/31932* (2013.01); *H03M 1/12* (2013.01)

(58) Field of Classification Search
CPC ............ G01R 31/2607; G01R 31/2608; G01R 31/2614; G01R 31/2621; G01R 31/31922; G01R 31/31932; G01R 31/3008; G01R 31/3004; G01R 31/318307; G01R 31/2884; G01R 31/31905; G01R 31/31924; G01R 31/318511; G01R 31/318505; G01R 31/318513; G01R 19/10

See application file for complete search history.

(56) References Cited

U.S. PATENT DOCUMENTS

| | | | |
|---|---|---|---|
| 5,126,594 A | 6/1992 | Shaik et al. | |
| 7,324,035 B2 * | 1/2008 | Harris | H03F 3/185 341/155 |
| 8,566,265 B1 * | 10/2013 | Cruz-Albrecht | G06N 3/049 706/27 |
| 2002/0019962 A1 * | 2/2002 | Roberts | G01R 31/3167 714/724 |

(Continued)

OTHER PUBLICATIONS

"Want to Measure Some Voltage? Read Our Intro on Oscilloscopes," Cole-Parmer Blog, Feb. 17, 2010, available at https://www.coleparmer.com/blog/2010/02/17/oscilloscopes/ (8 pages).

(Continued)

*Primary Examiner* — Thang X Le
(74) *Attorney, Agent, or Firm* — Alliance IP, LLC

(57) ABSTRACT

Technologies and methods for detecting voltage spikes on a semiconductor device include detecting a voltage spike in a first analog signal from a semiconductor device based on a comparison of the first analog signal and a first voltage threshold, and converting the first analog signal to a digital signal with a first pulse representing the voltage spike, and transforming the first pulse to a stretched pulse defining a greater width than the first pulse. More specific embodiments include receiving a second analog signal from a first pin on the semiconductor device during a capture time period, receiving a reference analog signal from a reference pin on the semiconductor device during the capture time period, and prior to detecting the voltage spike, generating the first analog signal by computing a difference between the second analog signal and the reference analog signal.

20 Claims, 12 Drawing Sheets

(56) References Cited

U.S. PATENT DOCUMENTS

2006/0284728 A1* 12/2006 Rubinstein ........ H02J 13/00009
375/257
2019/0199240 A1* 6/2019 Nene ..................... H02M 7/219

OTHER PUBLICATIONS

Neesgaard, Claus et al., "Voltage Spike Measurement Technique and Specification," Texas Instruments, Copyright 2003, available at http://www.ti.com/lit/an/slea025a/slea025a.pdf (11 pages).

* cited by examiner

VOLTAGE SPIKE DETECTOR AND SYSTEM FOR DETECTING VOLTAGE SPIKES IN SEMICONDUCTOR DEVICES

TECHNICAL FIELD

This disclosure relates in general to the field of semiconductor testing and, more particularly, to a voltage spike detector and system for detecting voltage spikes in semiconductor devices.

BACKGROUND

Voltage overstress is an event in which an electronic component is operated outside the limits of an absolute maximum rating (AMR), which is typically provided in a device data sheet of the electronic component. An AMR rating may be specified for a pin of a semiconductor device with respect to a reference pin of the semiconductor device. A reference pin is commonly a ground pin or a power supply pin. The AMR rating, however, can also be applied between two arbitrary pins of the device. An AMR rating has a high limit and a low limit, and the voltage applied to a particular pin cannot be greater than the high limit or less than the low limit, without risking permanent damage to the electrical component. Voltage overstress on semiconductor devices leads to damaged devices and cannot always be immediately detected. If voltage overstress is applied to semiconductor devices during a production test, it can result in defective parts being shipped to the customer. Therefore, semiconductor device manufacturers typically verify that no voltage above the high limit of the AMR or below the low limit of the AMR is ever applied to the device during testing. Debugging the occurrence of voltage spikes that extend outside the AMR limits during testing, such as a production release of test programs, can be a time-consuming activity. Detecting such voltage spikes and verifying that voltage spikes do not occur is typically performed with an oscilloscope, which can make it difficult to detect and isolate these problems.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DETAILED DESCRIPTION OF EMBODIMENTS

Overview

Figure 1:
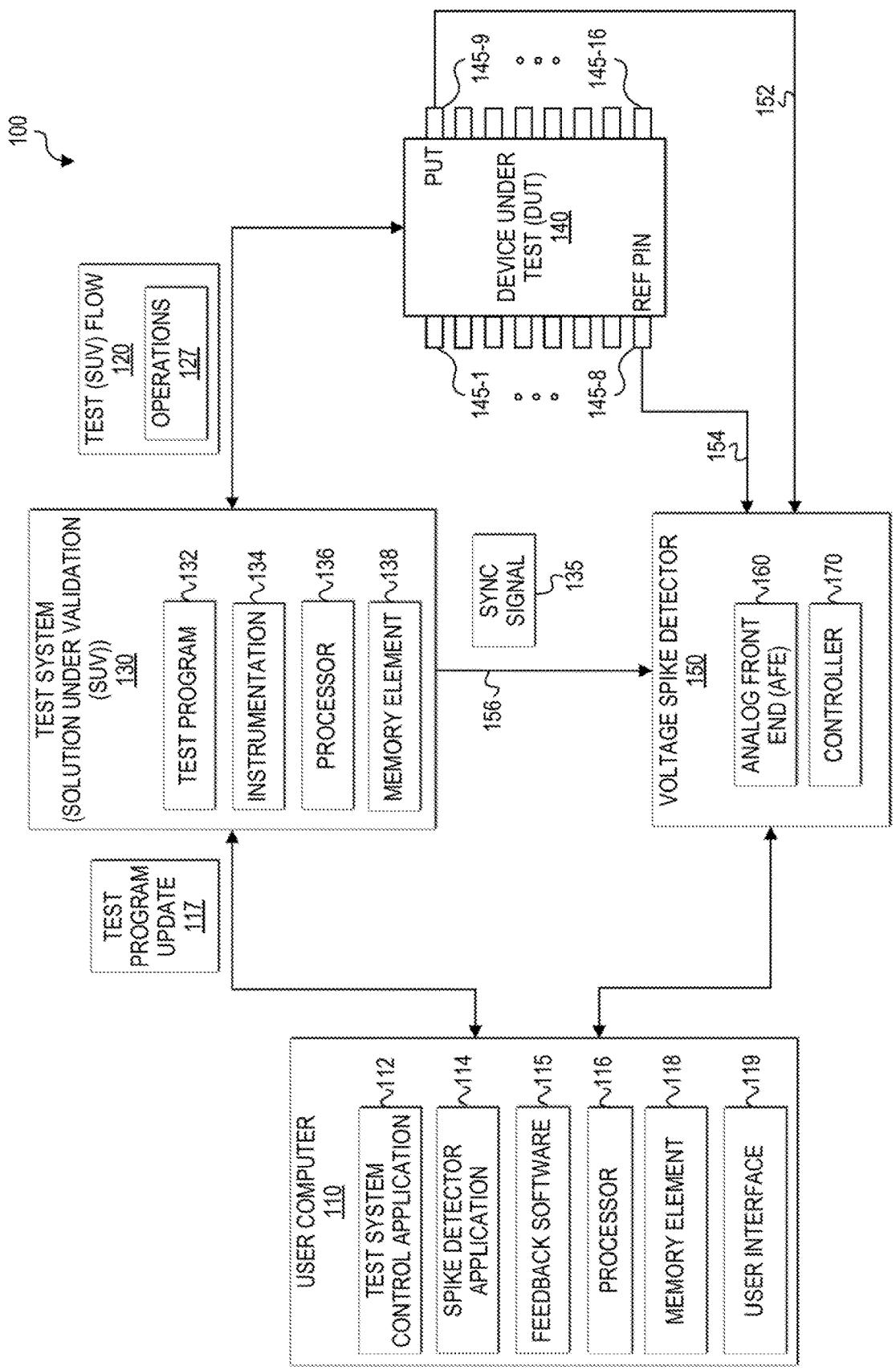
FIG. 1 is a simplified block diagram illustrating a system for detecting voltage spikes on a semiconductor device according to at least one embodiment.

An example method, apparatus and system for detecting voltage spikes caused by a test program running a test on a semiconductor device is provided and includes detecting a voltage spike in a first analog signal from a semiconductor device based on a comparison of the first analog signal and a first voltage threshold, converting the first analog signal to a digital signal with a first pulse representing the voltage spike, and transforming the first pulse to a stretched pulse defining a greater width than the first pulse. In more specific embodiments, the transforming the first pulse to the stretched pulse includes stretching the first pulse to the greater width by maintaining the first pulse at a high signal level for a configured time period. The configured time period may be based on a decay rate of a high pass filter and a second voltage threshold. The first voltage threshold can be one of a positive voltage or a negative voltage.

Further embodiments include generating location information for one or more stretched pulses in the digital signal, where the location information indicates respective locations in the digital signal corresponding to the one or more stretched pulses. The location information can include a first array of time stamps, where each time stamp in the first array of time stamps corresponds to a respective stretched pulse of one or more stretched pulses in the digital signal. In yet further embodiments, the method further comprises receiving one or more synchronization signals from a test system coupled to the semiconductor device, where the one or more synchronization signals represents a time reference for one or more operations being performed by the test system on the semiconductor device. The method may further include generating a second array of time stamps, where each time stamp in the second array of time stamps corresponds to a respective synchronization signal of the one or more synchronization signals. Yet further embodiments can include comparing the first array of time stamps to the second array of time stamps to generate information indicating a segment of the one or more operations that corresponds to the voltage spike. Additional embodiments include receiving a second analog signal from a first pin on the semiconductor device during a capture time period, receiving a reference analog signal from a reference pin on the semiconductor device during the capture time period, and prior to detecting the voltage spike, generating the first analog signal by computing a difference between the second analog signal and the reference analog signal.

Another example method, apparatus, and system for detecting voltage spikes is provided and may include detecting one or more voltage spikes in an analog signal, where the analog signal is obtained from a semiconductor device over a duration of a test program performing a test on the semiconductor device, and converting the analog signal to a digital signal with one or more pulses representing the one or more voltage spikes, respectively. The embodiment may further include generating location information of the one or more first pulses in the digital signal. More specific embodiments may include transforming the one or more first pulses to one or more stretched pulses, where the one or more stretched pulses each defines a greater width than a respective one of the one or more first pulses. The location information can be generated based on detecting the one or more stretched pulses in the digital signal.

EMBODIMENTS

Turning to FIG. 1, FIG. 1 is a simplified block diagram illustrating a system 100 for detecting voltage spikes on a semiconductor device in accordance with at least one embodiment. System 100 includes a user computer 110 with a test system control application 112, a spike detector application 114, feedback software 115, a processor 116, and a memory element 118. User computer 110 is coupled to a test system 130, which includes a test program 132, instrumentation 134, a processor 136, and a memory element 138. User computer 110 can use a test program update 117 to configure (e.g., program) test system 130 to perform any suitable tests, such as validation tests, production tests, and/or qualification tests on a device under test (DUT) 140. DUT 140 can be a semiconductor component or device with multiple pins 145-1 through 145-16. Each pin can each be evaluated for voltage spikes during a test flow 120. A test flow is intended to mean test operations 127, which can be a sequence of operations, of a test performed by test system 130 on a device under test. The sequence of operations may be performed as a result of test program 132 being executed. The test system can use hardware, software, firmware, instrumentation, or any suitable combination thereof to perform a sequence of operations on a DUT for a particular test.

System 100 also includes a voltage spike detector 150 comprising at least one analog front end (AFE) 160, a controller 170, and probes 152 and 154 for connecting to pins of a semiconductor device. During testing, voltage spike detector 150 captures test signals via first probe 152 for a pin under test (PUT) and via second probe 154 for a reference pin of the DUT 140. Voltage spike detector 150 is appropriately configured with suitable hardware components (e.g., attenuators, resistors, switches, capacitors, comparators, latches, filters, etc.) to enable interfacing with a device under test by probing pins of the device and capturing and evaluating analog signals from at least two pins during a test flow. For example, voltage spike detector 150 may be used for probing and have appropriate probing needles in its probes 152 and 154 to capture test signals from pins on the wafer. At least one synchronization signal 135 (also referred to herein as 'sync signal') is received by voltage spike detector 150 from test system 130 per test flow to synchronize a time reference for the test flow and the voltage spike detector during the test flow. In at least one embodiment, voltage spike detector 150 may include a sync probe 156 for connecting to test system 130 to enable the voltage spike detector to receive sync signals, such as sync signal 135, from the test system.

User computer 110 can provide control signals to configure voltage spike detector 150 for capturing and processing voltage spikes that occur on the DUT during a test flow. The control signals can include programmable configuration settings (e.g., attenuation level, positive voltage threshold, negative voltage threshold, START signal, STOP signal, capture time) for programming the voltage spike detector. The voltage spike detector can detect voltage spikes that are above a positive voltage threshold or below a negative voltage threshold. User computer 110 also receives output from voltage spike detector 150 that can be analyzed and used to determine precisely where a given voltage spike occurred during a test flow. In particular, the voltage spike may be narrowed down to a particular segment of a sequence of operations of the test flow.

For purposes of illustrating the techniques of system 100, it is important to understand the communications that may be traversing the system shown in FIG. 1. The following foundational information may be viewed as a basis from which the present disclosure may be properly explained. Such information is offered earnestly for purposes of explanation only and, accordingly, should not be construed in any way to limit the broad scope of the present disclosure and its potential applications.

Voltage spikes on semiconductor devices often result in permanent damage to the devices. In some situations, a voltage overshoot above a high limit (e.g., positive voltage threshold) or a voltage undershoot below a low limit (e.g., negative voltage threshold) is allowed for a specified period of time. Therefore, a voltage spike duration that exceeds the specified period for a particular device causes damage to the device. In other situations, a voltage spike (e.g., overshoot or undershoot) that occurs for any duration is not permitted as it can damage the device when occurring for any length of time.

Figure 2:
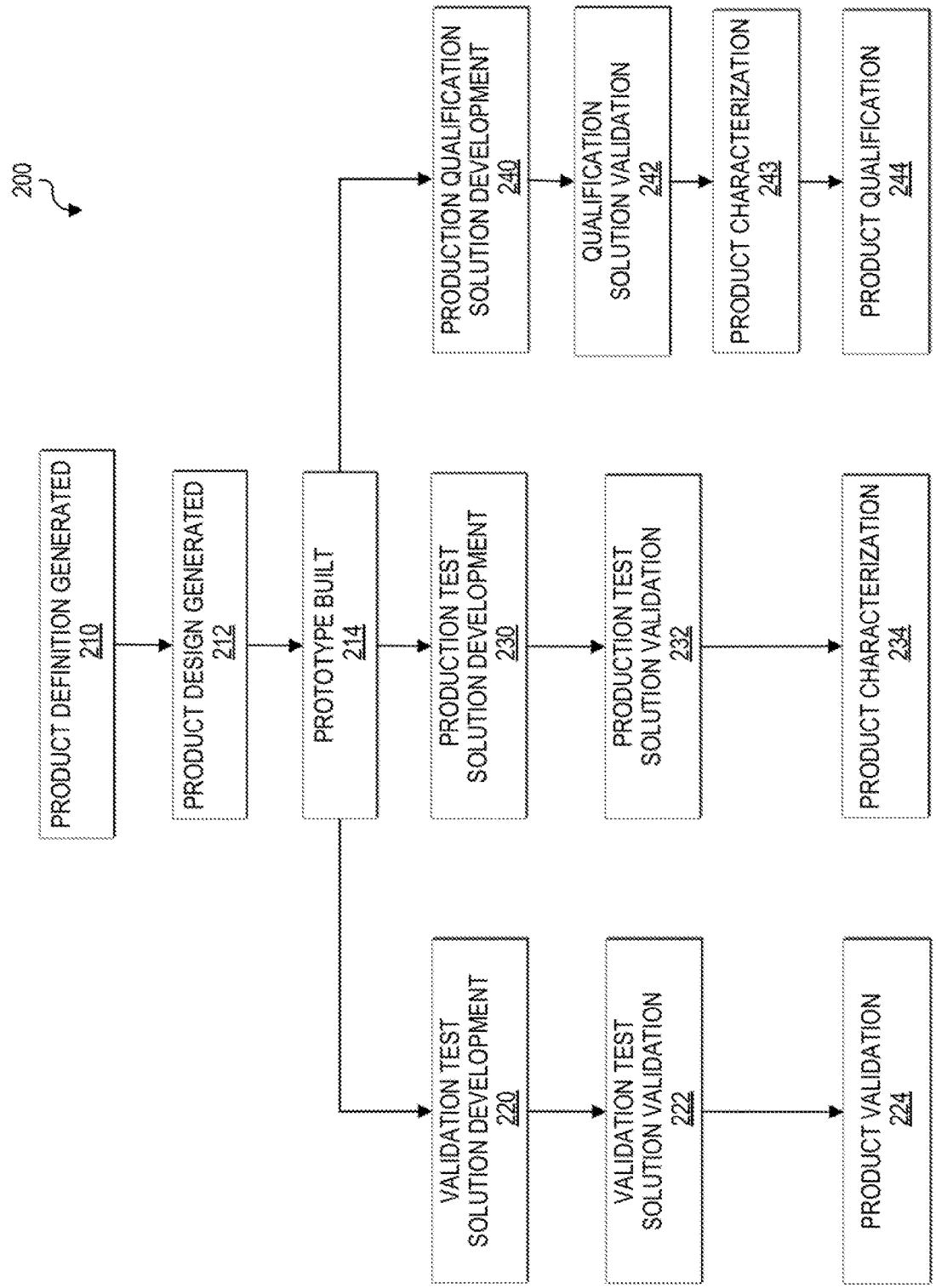
FIG. 2 is a simplified flowchart of example product development and production testing activities for semiconductor devices.

Voltage spikes on semiconductor devices can occur during many types of operations in semiconductor product development and production testing. FIG. 2 illustrates an example flow 200 of product development and production testing. At the outset, a semiconductor product definition is generated at 210, and a product design is generated at 212. At 214, a prototype of a semiconductor device (e.g., integrated circuit (IC)) is built and compared against the product definition and product design. The prototype can be provided to a validation team, a production test team, and a qualification team for debug and development testing. Each team can develop a solution (e.g., test system 130) to validate the IC. At 220, a validation test solution is developed. At 230, a production test solution is developed. At 240, a production qualification solution is developed. Each of the solutions can include a combination of hardware, software, firmware, instrumentation, or any suitable combination thereof to appropriately test the IC for validation, characterization, and qualification.

A validation test solution developed at 220 validates the product by exciting the IC (e.g., semiconductor device) electrically and determining whether the response meets the product design requirements. Voltage spikes during validation testing can lead to inconclusive validation results and product launch delays. To prevent the occurrence of voltage spikes during validation testing of a device, the validation test solution itself is validated at 222 before it is used to validate the product at 224.

A production test solution developed at 230 is used on the final product. Once the final product is produced from a factory, the production test solution is used to test the device and thus, characterize the product at 234. Production testing can be performed at various stages. For example, when the IC comes out of fabrication, it can be tested in wafer form. Once the IC is packaged, it can be tested in its packaged form. Finally, a burn-in test may be performed where the IC is exposed to higher voltages and temperature (also known as "burning") to accelerate failures to weed out any ICs that might otherwise fail in the field early in their lifespan. During production testing, the device is electrically excited and subjected to stimuli that is very different than what it would see during normal operation. Any voltage spikes outside the AMR rating at this stage of testing can fully or partially damage the device. A damaged device that is sold will eventually fail in the end system and can cause a system malfunction. Therefore, to prevent the occurrence of voltage spikes during production testing of a device, the production test solution itself is validated at 232 before it is used to characterize the product at 234.

A production qualification solution developed at 240 is used to ensure that the product can survive the desired lifetime for the product. For example, if the product is guaranteed for ten years, then the production qualification solution is designed to ensure that the product will work for ten years. The production qualification solution may include production testing (described above) to test the device and characterize the product at 243. The product qualification solution can also include various qualification testing that excites the IC electrically including, but not necessarily limited to, high temperature operating life (HTOL), early life failure rate (ELFR) testing, and biased highly accelerated stress test (BHAST). BHAST, for example, exposes the IC to moisture and various temperatures to see how the IC performs over a period of time. Any voltage spikes during these operations can cause a device to fail the product qualification. Such failure can lead to product launch delays or even product cancellation. To prevent the occurrence of voltage spikes during production qualification of a device, the production qualification solution itself is validated at 242 before it is used to test the device at 243 and 244.

Given the potential consequences of voltage spikes during product development and production testing, it is critical for semiconductor companies to ensure that their validation tests, production tests, and production qualification tests do not subject devices to voltage spikes outside the high and low limits of their AMR ratings. A traditional method for detecting voltage spikes is to use high-speed oscilloscopes, which can detect a transient voltage on a signal pin of a device. Typically, a high-speed oscilloscope is connected to a pin under test (PUT) of a device under test (DUT). The DUT is then subjected to electrical stimuli. The oscilloscope tries to capture the entire waveform on the PUT during a test, and then tries to isolate the occurrence of any spikes to specific test programming operations.

The traditional use of oscilloscopes to detect voltage spikes is time-consuming, imprecise, and difficult. First, a typical test program runs for seconds (or even tens of seconds), with resources connected to a pin switched tens or hundreds of times. Second, resolution and memory depth of a given oscilloscope are problematic, since a high sampling rate is needed to detect very short overstress voltage spikes and the entire span of the test program needs to be captured. Third, isolating the occurrence of a voltage spike to a specific program construct is also problematic, since timing of the test program is not precise and can vary from run to run by tens of milliseconds. Finally, a specification of maximum voltage is often across two pins. This requires a second instrument (e.g., differential probe) or differencing of captured waveforms to detect the spike.

Because oscilloscopes have a limited amount of capture memory, there is a trade-off between the time resolution and duration of capture. This can be expressed by the following formula: Capture duration/Time resolution=Memory in number of points. For a 10 nanosecond (ns) capture resolution for a 12 Meg points, the total duration will be 120 ms. The typical time resolution for spike detection is 10 ns or below. Thus, the total duration to capture and analyze is typically well under 1 second. Production test duration can be several seconds. Consequently, it is not possible to analyze a typical voltage spike for its entire duration in one capture.

To work around this issue, engineers evaluating a voltage spike engage in a cumbersome and inefficient process. Initially, the oscilloscope time resolution is set to a high value. For example, if the resolution is set to 1 ms with a 12 Meg scope, the capture duration increases to 12 sec. The wider spikes are identified and eliminated. The voltage at which the oscilloscope triggers is set to the AMR voltage. If the oscilloscope triggers, this indicates a voltage spike occurs somewhere in the production test sequence. Engineers performing the test may then go through a time-consuming iterative process to isolate the spike. First, the production test program is divided into smaller segments. Second, an external trigger is put at the beginning of a specific program segment, where each segment is equal to the duration of the oscilloscope capture (e.g., 120 ms). Finally, the production test program is run with enabling and disabling external triggers at various segments until the segment causing the spike is identified. The entire process is extremely time consuming, and can take, for example, around forty hours of engineering time on very expensive production equipment to validate a test solution.

Embodiments of system 100 disclosed herein can resolve the aforementioned issues and others associated with detecting voltage spikes caused by development and production tests (e.g., validation test solution, production test solution, production qualification solution) performed on semiconductor devices. System 100 can be used to detect any voltage overstress on semiconductor devices during test flows. Voltage overstress can include voltage spikes above a high (e.g., positive) programmable threshold or below a low (e.g., negative) programmable threshold. System 100 also enables a user to efficiently and precisely identify where voltage spikes occur in the test flow and to modify the test system to eliminate the voltage spikes during subsequent test flows.

System 100 includes test system 130 (also referred to herein as 'solution under validation' or 'SUV'), which is programmed to perform a particular test on a device under test (DUT). The SUV itself can be validated by running a test program at least once for each pin of the DUT and modifying the SUV as needed to eliminate voltage spikes for each pin. The test program can be configured (e.g., automatically or by a user) to send one or more sync signals to the voltage spike detector so that the SUV and the voltage spike detector have a common time reference. Thus, code in the test program and voltage spikes captured by the voltage spike detector can be correlated based on the common time reference. When a voltage spike occurs on a pin under test (PUT), the timing and/or frequency of sync signals may be adjusted, and the SUV can run the test again to more precisely identify when the voltage spike occurs during the test flow for the pin being tested. Once a segment of the test program is identified as corresponding to the voltage spike, the SUV may be modified to prevent the voltage spike from occurring. The test program may be repeated and adjusted until the voltage spike is eliminated from the test flow. Once voltage spikes are eliminated on the PUT, the SUV may run the test program again so that a different pin (or pins) on the DUT can be monitored by the voltage spike detector for voltage spikes. Each pin can be tested, and the SUV can be modified as needed until no voltage spikes are detected on any pin of the device during test flows performed by the SUV.

System 100 provides several advantages over traditional approaches to detecting and eliminating voltage spikes during development and production testing of semiconductor devices. Unlike oscilloscopes, embodiments of the voltage spike detector in system 100 can detect transient voltages in a long test program, where a transient voltage is a voltage spike or surge of electrical energy having a very short duration. This is possible at least in part due to the spike detector recording the locations (e.g., time stamps) of spikes while an oscilloscope records voltage values of all samples that are obtained based on a high sampling rate. Thus, the memory required by embodiments of the voltage spike detector can be minimized. For the example, using a 12 Meg memory, an embodiment of a voltage spike detector could detect 3 million spikes. Thus, the embodiment is limited by the number of spikes it can detect rather than being limited by the total duration over which it can detect spikes, as in an oscilloscope-based method. By storing the spike location information, memory is not wasted on storing information obtained from other areas of the waveform. In addition, embodiments of system 100 enable users to more efficiently and precisely identify a segment in a development or production test program that corresponds to a voltage spike detected on a particular PUT of a semiconductor device. The effort required to identify and isolate voltage spikes in a semiconductor device can be significantly reduced by system 100. Indeed, such spikes can be corrected in a matter of hours using system 100, as opposed to several days or weeks using traditional approaches. Thus, system 100 significantly improves the efficiency of detecting and resolving voltage spikes that occur during development and production tests for semiconductor devices.

Turning to the infrastructure of system 100 in FIG. 1, user computer 110, test system 130, voltage spike detector 150, and device under test (DUT) 140 represent nodes that form a network of interconnected communication paths for transmitting and receiving data and/or signals. Generally, a node may be an electronic device (e.g., computer, client, server, peer, service, application, processor, microprocessor, system, or other object) capable of sending, receiving, or forwarding information over communication paths in a network. Elements of FIG. 1 may be coupled to one another through one or more interfaces employing any suitable connection (wired or wireless), which provides a viable pathway for electronic communications. Additionally, any one or more of these elements may be combined, divided, or removed from the architecture based on particular configuration needs. The architecture of the present disclosure may also operate in conjunction with any suitable network protocol(s), where appropriate and based on particular needs. In addition, gateways, routers, switches, and any other suitable nodes (physical or virtual) may be used to facilitate electronic communication between various nodes in system 100.

In one or more embodiments, user computer 110 comprises test system control application 112 for communicating with test system 130. In one example implementation, a universal serial bus (USB) may be used to connect user computer 110 to test system 130. Test system control application 112 can be used to configure test system 130. For example, test system control application 112 can be used to configure the frequency and/or timing of sync signals to be generated by the test system when performing a test on the DUT. In at least one embodiment, test system control application 112 can be used to generate test program update 117 to program test program 132 with sync commands to generate sync signals during a test flow at the desired frequency and/or timing. In addition, test system control application 112 may be configured to allow a user to modify the test system to eliminate voltage spikes that have been detected and pinpointed in an operation or segment of operations of a test flow performed by the test system. In one or more embodiments, test program update 117 may be configured to modify or replace test program 132 of test system 130 with updated code that adjusts the sync signals frequency and/or timing and/or that affects the operations to be performed in order to prevent voltage spikes.

User computer 110 comprises spike detector application 114 for communicating with voltage spike detector 150, including sending control signals to voltage spike detector 150. In one example implementation, a universal serial bus (USB) may be used to connect user computer 110 to voltage spike detector 150. Control signals communicated to voltage spike detector 150 can include various configuration settings for attenuators, digital to analog converters (PDAC and NDAC) and digital to analog converters. The PDAC setting indicates a positive voltage threshold, above which any detected voltage is identified as a positive voltage spike. The NDAC setting indicates a negative voltage threshold, below which any detected voltage is identified as a negative voltage spike. Spike detector application 114 may also issue a START command to initiate the voltage spike detector to start monitoring voltage of a pin (or pins) under test after it receives a first sync signal from test system 130. A STOP command may be issued to voltage spike detector 150 to cause the voltage spike detector to stop monitoring the pin (or pins) under test. In at least one embodiment, the STOP command may be in the form of a capture time period that indicates how long the voltage spike detector is to capture voltage spikes from the PUT.

Spike detector application 114 may also receive data from voltage spike detector 150. The data or information can indicate the locations of voltage spikes in a waveform of a signal that is generated from a PUT during a test flow and detected by the voltage spike detector. In one example, this data or information can include the timing of the voltage spikes in the signal. The data or information can also include the timing of SYNC signals received by the voltage spike detector during the test flow. In one example, spike detector application 114 receives an array of time stamps in which each time stamp corresponds to a time that a respective voltage spike was detected. The time may be determined based on a time reference established by the first sync signal received by the voltage spike detector during the test flow. Spike detector application 114 can also receive an array of time stamps in which each time stamp corresponds to a time that a respective sync signal was received by the voltage spike detector during a test flow.

These arrays of time stamps may be generated by the voltage spike detector and sent to the user computer for each instance of the test system performing a test (e.g., running a test program) on the DUT. Based on the time stamps, a user can identify (e.g., via a graphical user interface, etc.) a segment in the code of a test program where the voltage spike occurs. If needed, the user may configure the test system to generate more sync signals at shorter intervals during the identified segment of code. Thus, when the test system repeats the test, the results can enable the user to more precisely pinpoint when the voltage spike occurs by narrowing the segment of code that is executed when the voltage spike occurs. The identified segment of code may cause one or more operations to be performed that may be modified to eliminate the voltage spike. In at least some scenarios, the sequence of operations may be modified by a user modifying the test program. Once the modification is completed, the test system may rerun the test program on the DUT to confirm that the voltage spike has been removed.

Feedback software 115 may be optionally provided in system 100. In one example, feedback software 115 may be configured as an application programming interface (API) on a computing system such as user computer 110 and may communicate with both test system 130 and voltage spike detector 150. Feedback software 115 can evaluate data (e.g., arrays of time stamps) received from voltage spike detector 150 to determine whether to adjust the settings of the test system and/or the voltage spike detector and cause the test system to rerun the test program with the new settings. For example, after a test flow, feedback software 115 may determine that an identified segment of code of a test program needs to be narrowed down to a shorter time frame in order to more precisely identify the particular code corresponding to the occurrence of a voltage spike. In this scenario, feedback software 115 may instruct the test system control application 112 to adjust the sync signal frequency and/or timing in the test system in order to narrow down the segment of code that corresponds to the voltage spike in a subsequent test flow. In another example, after a test flow, feedback software 115 may determine that the voltage level of a particular voltage spike needs to be identified. In this scenario, feedback software 115 can instruct spike detector application 114 to adjust the upper or lower voltage threshold (depending on whether the voltage spike was positive or negative) to pinpoint the actual voltage level of the spike in a subsequent test flow.

Consider an illustration in which a positive voltage threshold is adjusted automatically in the voltage spike detector 150 by feedback software 115. If a positive voltage threshold (e.g., PDAC setting) is set to a value of 5 volts and a positive voltage spike is detected on a pin of a DUT during a test flow by the test system, then the threshold may be reset to a value of 5.5 volts and test system 130 can rerun the test. If a voltage spike is not detected based on the new threshold, then it is known that the first voltage spike was between 5 volts and 5.5 volts. Thus, the feedback software 115 may instruct the spike detector application 114 to adjust the positive voltage threshold (e.g., PDAC setting) incrementally by a value of 0.1 volts (e.g., 5.1 v, 5.2 v, 5.3 v, and 5.4 v), and to send a START command to the voltage spike detector. Feedback software 115 may also send a START command to test system 130 to rerun the test on the DUT. In this way, the level of voltage corresponding to the detected voltage spike can be pinpointed. Without feedback software 115, a user may manually make these same adjustments during testing.

Consider another illustration in which sync signals are adjusted automatically by feedback software 115. If a voltage spike is detected between sync signals that occur at 5-second intervals, then the test program may be modified to execute sync signal commands more frequently (e.g., at 0.5 second intervals). Thus, the feedback software 115 may configure test program update 117 (or may instruct test system control application 112 to configure test program update 117) to program test program 132 with additional sync commands so that the sync signal frequency is 0.5 second intervals. The test system can rerun the test program on the DUT. With this modification, the segment of code in the test program that corresponds to the voltage spike can be more precisely identified.

In another scenario, a binary search for the time at which a voltage spike occurred may be performed by adjusting sync signals. In this scenario, feedback software 115 may configure test program update 117 (or may instruct test system control application 112 to configure test program update 117) to program test program 132 with a sync command to cause a sync signal to be generated in the middle of the interval during which the voltage spike was detected. For example, if the voltage spike occurred between seconds 5 and 10 of the test flow, a sync command may be inserted to generate a sync signal at second 7.5 of the test flow. Feedback software 115 may continue to modify the sync signal timing in this manner until the voltage spike is correlated to a sufficiently narrow segment of code of the test program.

In other embodiments, feedback software 115 may not be provided and a user may manually make modifications during the validation of the test system. For example, adjustments to voltage threshold settings and attenuator settings on the voltage spike detector may be made via user interface 119 and spike detector application 114. Adjustments to sync signal frequency and/or timing (e.g., by modifications to test program 132) may be made via user interface 119 and test system control application 112. Additionally, modifications to the test system to eliminate a voltage spike (e.g., by modifications to test program 132) may be made via user interface 119 and test system control application 112.

As shown in FIG. 1, in some implementations, user computer 110 is communicably coupled to both test system 130 and voltage spike detector 150. In other implementations, however, test system control application 112 and spike detector application 114 may be provisioned on separate computing systems. For example, a first computing system provisioned with test system control application 112 can be communicably coupled to test system 130, and a second computing system provisioned with spike detector application 114 can be communicably coupled to voltage spike detector 150. Accordingly, a user can access the first computing system to interact with test system 130 to set sync signal frequency and/or timing, to cause the test system to perform a test on a DUT, and/or to modify the test program. A user can access the second computing system to interact with voltage spike detector 150 to send control signals to the voltage spike detector (e.g., attenuation settings, voltage threshold settings, START signals, STOP signals, and/or capture times) and/or to receive data related to voltage spikes detected during an SUV flow.

In one or more embodiments, test system 130 comprises test program 132, instrumentation 134, processor 136, and memory element 138. One or more of these components may include, but are not necessarily limited to specialized hardware including source and capture instruments, such as test controllers, arbitrary waveform generators (AWGs), digitizers, voltmeters, power supplies, parametric measurement units, digital multi-meters, multiplexers, analog-to-digital converters, digital-to-analog converters, clocks, electronic relays and switches, comparators, electrical clamps, and other electronic test equipment. Generally, test system 130 can be suitably configured to measure a wide variety of circuits and electronic components, from resistors and capacitors to highly complex mixed-signal integrated circuits.

Components of test system 130 cooperate to run a test on a device under test (e.g., DUT 140). When a test is run by test system 130, one or more operations 127 are performed on a DUT during a test flow 120. In system 100, the test system is validated to ensure that any voltage spikes produced in the DUT by the test flow are identified and mitigated before the test system is used in the product development and production processes. A test system that is being validated in system 100, which is also referred to herein as a 'solution under validation' or 'SUV,' may perform different types of tests including, but not necessarily limited to a validation test solution, a production test solution, and/or a production qualification solution. In some implementations, test system 130 may be programmed (e.g., by test program update 117) to run different types of tests for a given DUT. In other implementations, a different test system (e.g., 130) may be provided for each type of test to be run against a given DUT.

In some embodiments, test system 130 includes a master controller (e.g., processor 136) that synchronizes one or more devices (e.g., voltage spike detector 150) by generating at least one sync signal during a test flow. Test system 130 can be suitably connected to voltage spike detector 150 to enable sync signals 135 to be transmitted from the test system to the voltage spike detector during a test flow to validate the test system. In one example, voltage spike detector 150 may include a sync probe that is removably connected (e.g., by a user) to the test system for receiving sync signals.

Test system 130 is also suitably connected to DUT 140 to enable electrical signals to be communicated between the components. DUT 140 may be physically connected to test system 130 by a robotic machine (e.g., a Handler or Prober) and through a customized Interface Test Adapter (ITA) such as a device interface board (not shown) that adapts resources of the test system 130 to DUT 140. Test system 130 may also be configured with one or more Peripheral Component Interconnect Express (PCIe) slots for accommodating signal sensing cards communicating signals to and from DUT 140. Generally, test system 130 can generate an electrical signal to excite the DUT and capture its response. In some embodiments, test system 130 may analyze the captured data from DUT 140. In other embodiments, some or all of the captured data may be transmitted to another system, such as user computer 110, for analysis.

System 100 may be used to validate test systems (or SUVs) on any number of electronic devices. DUT 140 is one non-limiting example of a semiconductor device that may be used in system 100 to validate a test system. The semiconductor device may be a die on a wafer or may be a packaged part, including system on chips and integrated circuits. In the example shown in system 100, DUT 140 includes multiple pins 145-1 through 145-16. Each pin can be tested for voltage spikes during one or more test flows (or SUV flows). Thus, if three test systems are to be validated on DUT 140, each pin may be tested for each of the three test systems. Although system 100 is described herein with reference to development and production testing (e.g., validation test solution, production test solution, production qualification solution), the concepts are not so limited. System 100 may be applicable for any type of test or production flow applied to the DUT that may cause voltage spikes in the DUT.

In one or more embodiments, voltage spike detector 150 comprises analog front end (AFE) 160 and controller 170. Voltage spike detector 150 is suitably connected to DUT 140 to enable electrical signals to be communicated from the DUT to the voltage spike detector. Two probes 152 and 154 of voltage spike detector 150 may be removably connected to the DUT. One probe (e.g., 152) may be connected to a pin under test (PUT) 145-9 and the other probe (e.g., 154) may be connected to a reference pin 145-8 against which a voltage spike on the PUT pin 145-9 can be evaluated. Typically, the reference pin is a ground pin, which forms the voltage reference for the DUT. However, at least some voltage spike testing may be performed between two arbitrary pins on the DUT.

AFE 160 receives analog test signals from pins (e.g., 145-8 and 145-9) connected to its probes (e.g., 154 and 152) and converts the analog test signals to a digital signal that can be understood by controller 170. The analog test signals include normal voltage signals from the pins in addition to spiked voltage signals, if any. Voltage spikes include signals in a positive direction that exceed an upper voltage threshold that represents a maximum voltage level. This is referred to as an 'overshoot'. Voltage spikes also include signals in a negative direction that fall below a lower voltage threshold that represents a minimum voltage level. This is referred to as an 'undershoot'. A positive or negative voltage spike received by AFE 160 is converted to a high digital signal. In at least one embodiment, an upper voltage threshold is a positive value and a lower voltage threshold is a negative value. In any given test flow one or more positive voltage spikes may occur, one or more negative voltage spikes may occur, both positive and negative voltage spikes may occur (although not simultaneously), or no voltage spikes may occur.

In one or more embodiments, controller 170 is a digital controller that is communicably coupled to user computer 110 to enable data and/or signals to be communicated between the two devices. Controller 170 may receive control signals from user computer 110 with programmable configuration settings for a particular DUT and/or test flow. Control signals can also include a START signal that causes the voltage spike detector 150 to detect the next sync signal from the test system and begin capturing voltage spikes from one or more pins under test. Control signals can also include a capture time that specifies the amount of time the voltage spike detector is to capture voltage spikes. Capture time generally corresponds to the amount of time a particular test program of an SUV is known to run. However, capture time may include some additional time as a buffer to ensure that all voltage spikes are captured if the test flow runs longer than expected.

During a test flow, controller 170 can receive a digital signal resulting from an AFE (e.g., 160) combining and converting captured voltage signals from the pin under test and the reference pin. In at least one embodiment, the digital signal may be a sequence of square wave electrical pulses that vary between a low (e.g., zero) and a high (e.g., one) signal level. One or more pulses in a digital signal indicates one or more positive voltage spikes or one or more negative voltage spikes. A digital signal with one or more pulses indicating one or more voltage spikes can be evaluated based on a reference time from a received sync signal provided by the test system to generate information indicating the time that the voltage spikes occurred during the test flow. In addition, the one or more sync signals can be evaluated to generate information indicating the time that was indicated by the one or more sync signals received during the test flow. In at least one embodiment, this generated information may be in the form of an array of one or more time stamps for the detected positive voltage spikes (if any), an array of one or more time stamps for the detected negative voltage spikes (if any), and an array of one or more time stamps for the one or more sync signals. The arrays of time stamps can be provided to user computer 110 for evaluation and modification of the test system, if needed to eliminate voltage spikes. Although timing information (e.g., time stamps) for voltage spikes in a digital signal may be used in one or more embodiments, it should be noted that any other suitable information indicating the location of the voltage spikes in the waveform of the digital signal may be used instead.

User computer 110 receives data related to captured voltage spikes from voltage spike detector 150. This data can include the array(s) of time stamps for captured voltage spikes and the array of time stamps for sync signals. In at least one embodiment, spike detector application 114 can be configured to provide the data in a user-understandable format via a user interface 119 (e.g., a graphical user interface) on a display screen of user computer 110. The user interface 119 can be configured to enable a user to view data related to the voltage levels (e.g., normal or spikes) during the test flow for the particular pin or pins under test. If more precise voltage level corresponding to a voltage spike are desired, a user may provide appropriate input to spike detector application 114 to adjust configuration settings on the voltage spike detector 150 (e.g., positive or negative voltage thresholds). If more precise timing information corresponding to a voltage spike is desired, a user may also provide appropriate input to test system control application 112 to modify sync signals and to rerun the SUV for the pin or pins being tested. Furthermore, a user may modify the SUV (e.g., by modifying the code of test program 132) to eliminate one or more voltage spikes. If no voltage spikes have been detected, the user may adjust the probe or probes (e.g., 145-9) and rerun the SUV to test the next pin for voltage spikes.

Figure 3:
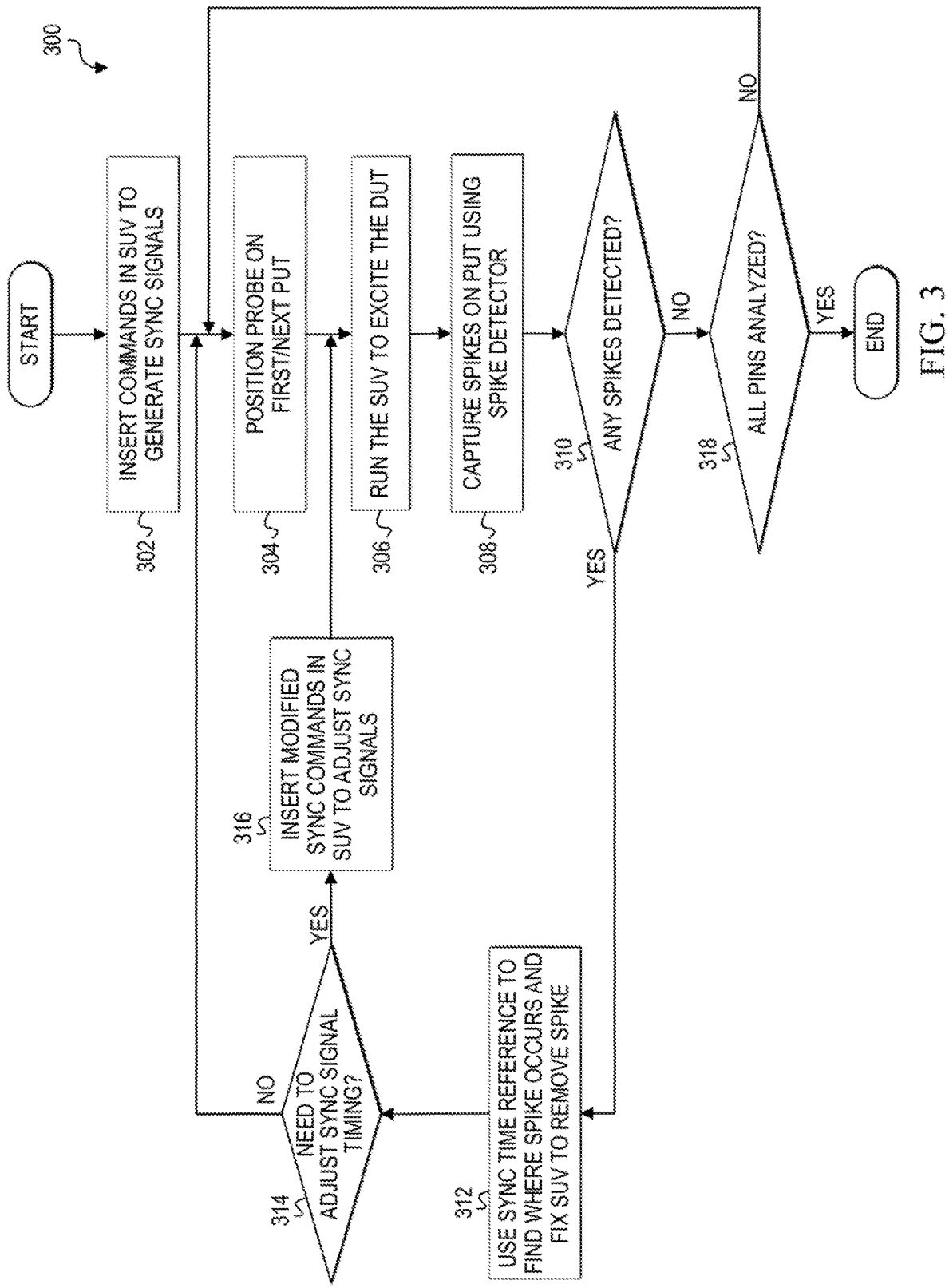
FIG. 3 is a simplified flowchart illustrating example activities that may be associated with an embodiment of the system.

Turning to FIG. 3, FIG. 3 is a simplified flowchart of a process 300 for product development and production testing for semiconductor devices to validate that a particular test system (or SUV) does not cause voltage spikes on a device under test. At 302, an SUV (e.g., 130) is prepared by inserting one or more sync commands into its test program to generate one or more synchronization signals at a desired frequency and/or timing during testing by the SUV of a device under test. For example, a user may use a user computer (e.g., 110) to configure a test program update (e.g., 117) to modify the test program by inserting sync commands at desired points in the code. In other implementations, the test program update may be configured automatically based on predetermined or learned frequency and/or timing for sync commands to be used in the particular SUV.

At 304, a user connects a PUT probe (e.g., 152) of a voltage spike detector (e.g., 150) to a first pin to be tested (e.g., 145-1) on a DUT (e.g., 140). The user also connects a reference probe (e.g., 154) to a reference pin (e.g., 145-8). A sync probe (e.g., 156) can also be connected by the user to the test system to receive sync signals. In at least some scenarios, the sync probe and the reference probe are not moved during the SUV testing of each pin on the DUT.

At 306, the SUV is run by executing the test program to excite (e.g., test) the DUT, and voltage on the PUT is monitored by the voltage spike detector via the PUT probe and the reference probe until the test flow ends. At 308, an analog test signal is captured from the PUT pin and the reference pin by the voltage spike detector. One or more voltage spikes can be detected in the analog test signal if, at any point in the signal, the voltage on the PUT exceeds a positive voltage threshold or falls below a negative voltage threshold. The determination of whether the PUT exceeds a positive voltage threshold or falls below a negative voltage threshold may be assessed relative to the voltage of the signal from the reference pin.

After the test flow ends, data representing the one or more voltage spikes may be provided to the user computer for evaluation by a user and/or feedback software, if provisioned on the user computer. In addition, data representing the one or more sync signals received by the voltage spike detector from the SUV may be provided to the user computer. At 310, a determination is made as to whether any voltage spikes were detected on the PUT during the test flow. In some implementations, this determination may be made by a user based on information presented in a graphical user interface, for example. In other implementations, this determination may be made by feedback software (e.g., an API) that identifies voltage spikes based on data received from the voltage spike detector.

If a voltage spike is detected, then at 312, a sync time reference can be used to determine where the spike occurred in the code of the test program. For example, if multiple sync signals were received, a sync time reference preceding the voltage spike and a sync time reference following the voltage spike can be used to narrow down where in the test flow the voltage spike occurred. If the data representing the voltage spike enables identification of a sufficiently narrow segment of the code of the test program where the voltage spike occurred, then the SUV may be modified to eliminate the voltage spike when that segment of code is run.

At 314, a determination is made as to whether the frequency and/or timing of the sync signals needs to be adjusted to more precisely identify where the voltage spike occurred within the code of the test program. For example, if the data received from the voltage detector does not enable identification of a sufficiently narrow segment in the code where the voltage spike occurred, then the frequency and/or timing of the sync signals can be adjusted at 316, by modifying the code of the test program to adjust the timing and/or frequency of sync commands. Then, at 306, the modified test program is run again without changing the probes so that the same PUT is monitored for voltage spikes using the modified sync commands. In one example, the modified sync commands may cause sync signals to be issued at a higher frequency (i.e., shorter time intervals). In another example, the modified sync commands may cause the sync signal to enable a binary search of a voltage spike by issuing a sync signal in the middle of a segment of the SUV flow during which the voltage spike occurred in the prior SUV run.

At 314, if a determination is made that the timing of the sync signals does not need to be adjusted, then at 304, the PUT probe is connected to the next pin (e.g., 145-2) to be tested. At 306, the SUV is run by executing the test program again to monitor voltage on that next PUT and the process continues as previously described. This activities described at 312-316 can be performed for each voltage spike that is identified in the analog signal received from the voltage spike detector for a particular test flow.

As previously described herein, in some implementations, the determination of whether the frequency and/or timing of the sync signals needs to be adjusted may be performed by a user and commands to modify the timing and/or frequency of sync signals may be inserted in the code of the test program by the user. In one example, a test program update (e.g., 117) may be configured by a user to insert the desired sync commands into the test program and to rerun the SUV using the modified test program.

In other implementations, if a feedback application (e.g., 115) coordinates communication between a spike detector application (e.g., 114) and a test system control application (112), then the determination of whether the sync signal timing needs to be adjusted and the configuration of a test program update (e.g., 117) may be performed automatically by the feedback application. In this scenario, the feedback application could evaluate data received from voltage spike detector and configure a test program update to insert the desired sync commands into the test program and to rerun the SUV using the modified test program. Alternatively, the feedback application could issue instructions to the test system control application to configure the test program update.

With reference again to 310, if it is determined that no voltage spikes were detected during the test flow, then at 318, a determination is made as to whether all pins on the DUT have been tested. If any pins on the DUT have not been tested, then the process returns to 304, where the PUT probe is connected to the next pin to be tested. Then, at 306, the SUV is run again to monitor voltage on that next PUT.

At 318, if a determination is made that all pins on the DUT have been tested, then process 300 ends.

Figure 4:
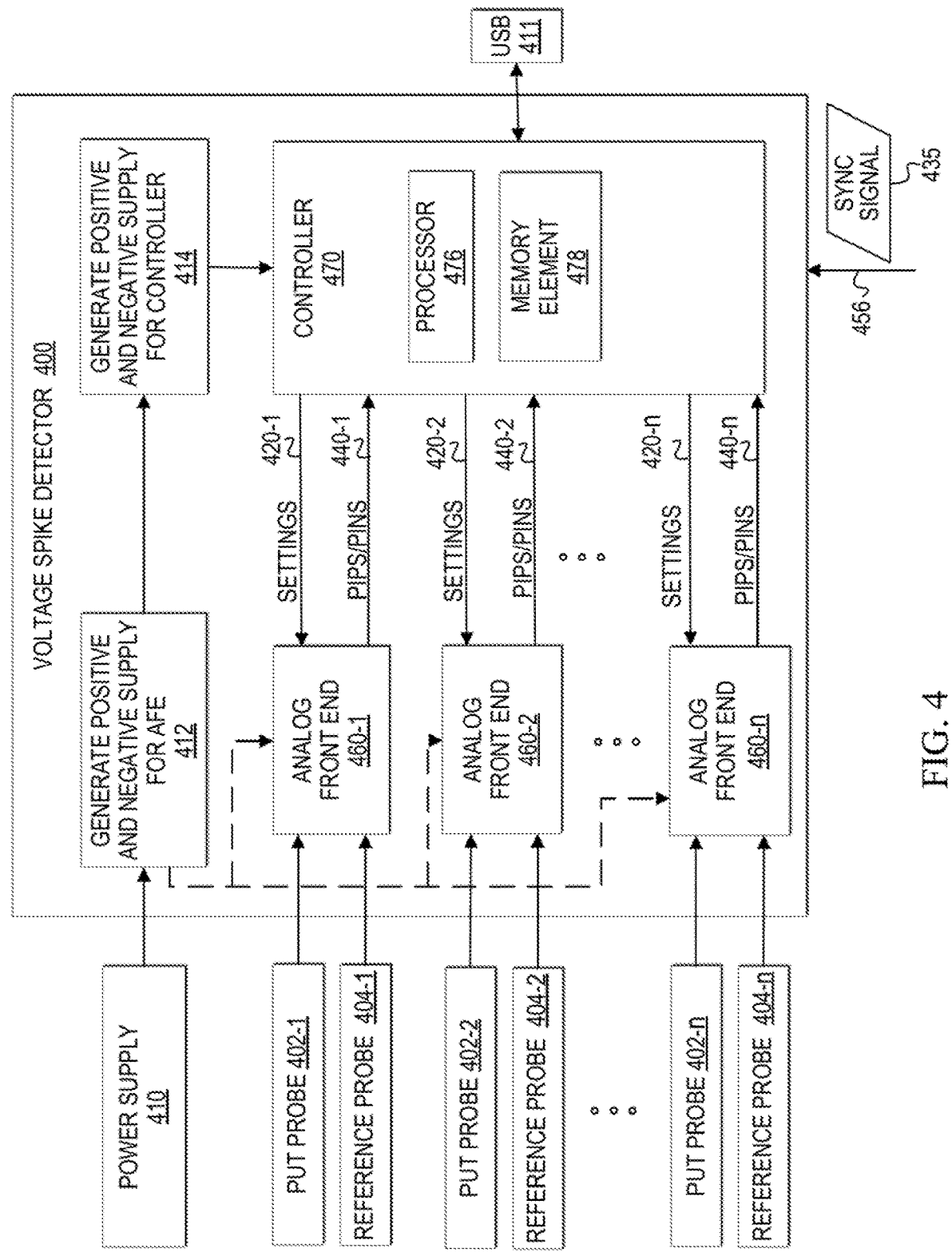
FIG. 4 is a simplified block diagram illustrating yet other example details of embodiments associated with the system.

FIG. 4 is a simplified block diagram illustrating example details of a voltage spike detector 400. Voltage spike detector 400 is a more detailed illustration of one possible embodiment of voltage spike detector 150. In at least one embodiment, voltage spike detector 400 can include multiple analog front ends (AFE), as indicated by analog front end (AFE) 460-1, analog front end (AFE) 460-2, through analog front end (AFE) 460-n. Voltage spike detector 400 also includes a controller 470, including a processor 476 and a memory element 478.

A power supply 410 may be attached to a wall outlet or other suitable electricity supply and provide power for the components of voltage spike detector 400. Power supply 410 can generate positive and negative power at 412 for the AFEs and can generate positive and negative power at 414 for controller 470.

In at least one embodiment, the voltage spike detector can be configured to monitor multiple PUTs in parallel. Two probes can be provided for each PUT on a device under test. PUT probe 402-1 and reference probe 404-1 can be provided for a first PUT. PUT probe 402-2 and reference probe 404-2 can be provided for a second PUT. PUT probe 402-n and reference probe 404-n can be provided for an n$^{th}$ PUT. The number of PUTs that can be handled by the voltage spike detector indicates the number of channels for the device. For example, if the voltage spike detector can handle two PUTs in parallel, then the voltage spike detector has two channels. Multiple channels may be desirable to save time during testing. Typically, a voltage spike detector may have one to three channels, although it may be configured to accommodate any number of channels.

A sync probe 456 may be provided to receive sync signals 435 from an SUV. In at least one embodiment, the sync signal is a digital signal, which has a limited voltage range and a clean digital signal received by controller 470. Sync signal 435 is used to mark a time by sending a digital signal to controller 470, so that the SUV and the voltage spike detector have the same time reference.

In at least one embodiment, controller 470 may communicate with a user computer via a USB 411. The user computer may send control signals to controller 470 via USB 411. Some of the control signals are provided to the AFEs by the controller. For example, a control signal may be sent to the voltage spike detector with instructions to capture voltage spikes that exceed a desired positive threshold (PDAC) or that fall below a desired negative threshold (NDAC). By way of illustration only, if a user wants to detect positive spikes at 5 volts and negative spikes at −3 volts, the control signals could instruct the controller 470 to set the positive and negative spike thresholds to 5 volts and −3 volts, respectively. Attenuation settings may also be provided to controller 470 from a user computer. These settings can be provided to AFEs 460-1 through 460-n from controller 470 at 420-1 through 420-n.

Other control signals provided to controller 470 from a user computer can include a capture time period for which the voltage spike detector is to capture voltage spikes on the one or more pins under test. For example, the capture time period may be 12 seconds for an SUV that runs for 10 seconds. This setting can allow some margin for ensuring that all voltage spikes are captured (e.g., if the test runs longer than usual).

A START command may also be issued to voltage spike detector from the user computer via USB 411 so that the voltage spike detector knows to begin capturing voltage spikes on the PUTs as soon as a sync signal is received from the SUV. A START command may also be issued to the SUV to cause the SUV to execute its test program in order to test the DUT.

When the test program is executed, the PUT probes 402-1 through 402-n capture voltage on the PUTs by transmitting analog signals from the PUTs to their respective AFEs 460-1 through 460-n. The reference probes 404-1 through 404-n capture voltage on the reference pins by transmitting analog signals from the reference pins to the AFEs 460-1 through 460-n. In at least some scenarios, the same reference pin may be used for each of the reference probes. The AFEs receive the analog signals from the probes, which may include voltage spikes, and convert the analog signals into a respective digital signal for each pair of probes (e.g., 402-1 and 404-1, 402-2 and 404-2, 402-n and 404-n).

One or more of the respective digital signals may include one or more pulses that indicate positive voltage spikes or negative voltage spikes. A digital signal with one or more pulses indicating a positive voltage spike is referred to herein as a pulse indicating positive spike (PIPS). A digital signal with one or more pulses indicating a negative voltage spike is referred to herein as a pulse indicating negative spike (PINS). The PIPS and/or PINS are provided to controller 470 from the AFEs. For each positive spike, a high (i.e., digital one) is present on the PIPS line. For each negative spike in the negative direction, a high (i.e., digital one) is present on the PINS line. The AFEs provide PINS/PIPS to controller 470 at 440-1 through 440-n.

Figure 5:
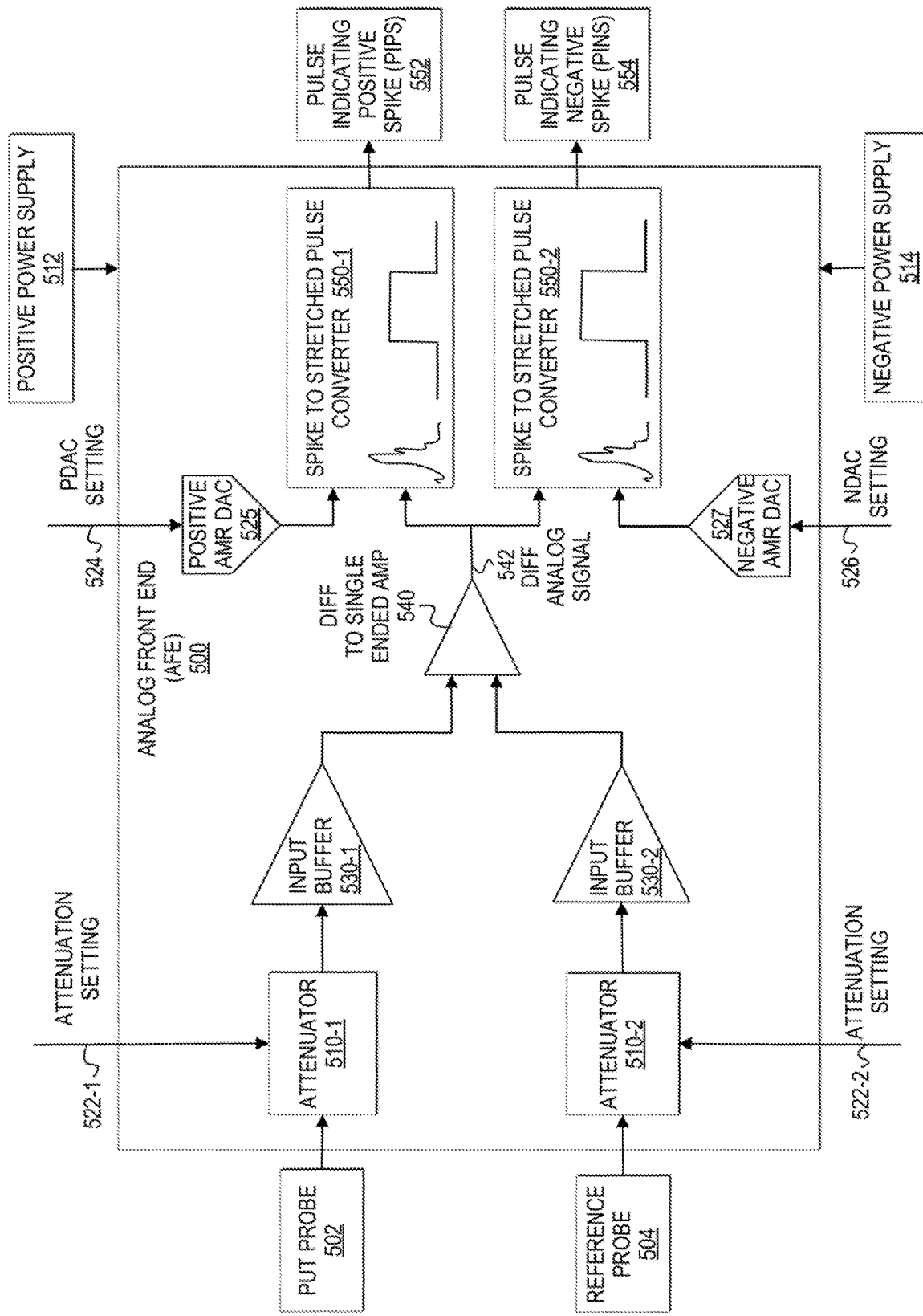
FIG. 5 is a simplified block diagram illustrating yet other example details of selected components of embodiments of the system.

FIG. 5 is a simplified block diagram illustrating example details of an analog front end (AFE) 500 in a voltage spike detector (e.g., 150, 400). AFE 500 is a more detailed illustration of one possible embodiment of analog front ends disclosed herein, such as AFE 160 and AFEs 460-1 through 460-n. AFE 500 can include attenuators 510-1 and 510-2, input buffers 530-1 and 530-2, a differential to single ended amplifier 540, a positive AMR digital to analog converter (DAC) 525, a negative AMR digital to analog converter (DAC) 527, and spike to stretched pulse converters 550-1 and 550-2. Attenuation settings 522-1 and 522-2, PDAC setting 524, and NDAC setting 526 are provided to AFE 500 from a controller of the voltage spike detector and represent examples of settings 420-1 through 420-n provided to AFE 460-1 through AFE 460-*n*. Also, a positive power supply 512 and a negative power supply 514 are provided to AFE 500.

A PUT probe 502 and a reference probe 504, which are examples of PUT and reference probe pairs disclosed herein (e.g., 152 and 154, 402-1 and 404-1, 402-2 and 404-2, 402-*n* and 404-*n*) are connected to AFE 500. PUT probe 502 carries analog signals from a pin under test of a device under test to AFE 500. Reference probe 504 carries analog signals from a reference pin on the device under test to AFE 500. Although the reference pin is often a ground pin, in some scenarios, a reference pin may be an arbitrary, non-ground pin on the DUT.

Analog signals from a DUT can have a significantly greater voltage range than the electronic components inside a voltage spike detector. For example, a DUT may carry analog signals in a 200 volt range, while electronics inside the voltage spike detector could run in the +/−5 volt range. Thus, attenuators 510-1 and 510-2 may be configured to receive signals from PUT probe 502 and reference probe 504, respectively, and to attenuate the voltage of the signals to adapt to the electronics in the AFE. Attenuators 510-1 and 510-2 may be voltage dividers in at least one embodiment, and attenuation settings 522-1 and 522-2 indicate by how much to divide the incoming voltage. For example, a DUT in the range of 200 volts would have a different attenuation setting than a DUT in the range of 20 volts. Additionally, any number of attenuators may be implemented for each probe.

Input buffers 530-1 and 530-2 are provided for attenuators 510-1 and 510-2, respectively. Input buffers isolate any effect of the remaining electronics on the input signal and produce an attenuated signal for further processing.

Differential to single ended amplifier 540 receives the attenuated signals from input buffers 530-1 and 530-2 and subtracts the attenuated signals to produce a difference analog signal 542. Difference analog signal 542 indicates positive and negative spikes in the analog signal from put probe 502 relative to the analog signal from reference probe 504.

The difference analog signal 542 is provided to two spike to stretched pulse (STSP) converters 550-1 and 550-2. One STSP converter (e.g., 550-1) detects positive voltage spikes (e.g., above the positive voltage threshold), and the other STSP converter (e.g., 550-2) detects negative voltage spikes (e.g., below the negative voltage threshold). Because voltage spikes can be extremely short (e.g., nanoseconds), converting a voltage spike to a pulse can render the spike undetectable by digital logic. Accordingly, STSP converters 550-1 and 550-2 are used to reduce the frequency or speed of a detected voltage spike, so that the pulse is essentially stretched from one width indicating a first window of time (or duration) to a greater width indicating a second window of time that is longer than the first window of time (or duration). Stretching the pulse enables the digital controller (e.g., 170, 270, 800) to detect and understand that a spike occurred in a given window of time.

PDAC setting 524 is input to positive AMR DAC 525, which outputs an analog signal of a positive voltage threshold. This analog signal of the positive voltage threshold is provided to STSP converter 550-1. NDAC setting 526 is input to negative AMR DAC 527, which outputs an analog signal of a negative voltage threshold. This analog signal of the negative voltage threshold is provided to STSP converter 550-2. In one non-limiting example, a positive voltage threshold may be set to 5 volts, and a negative voltage threshold may be set to −2 volts. STSP converter 550-1 can determine whether, compared to the positive voltage threshold, a positive spike is present in the difference analog signal. Similarly, STSP converter 550-2 can determine whether, compared to the negative voltage threshold, a negative spike is present in the difference analog signal. In at least some embodiments, the actual voltage level of the spike is not needed because, if any spike at all exceeds the upper voltage threshold or falls below the lower voltage threshold, then corrective measures are to be taken regardless of the particular spike level. In other embodiments, determining the actual voltage level of the spike may be achieved as previously described herein by modifying the appropriate voltage thresholds and running the test program again.

In one scenario, a voltage spike is detected in STSP converter 550-1 with respect to the positive voltage threshold, and no voltage spike is detected in STSP converter 550-2 with respect to the negative voltage threshold. In this scenario, the output or pulse indicating positive spike (PIPS) 552 is generated from STSP converter 550-1 as a digital logic one, and the output or pulse indicating negative spike (PINS) 554 is generated from STSP converter 550-2 as a digital logic zero. In another scenario, a voltage spike is detected in STSP converter 550-2 with respect to the negative voltage threshold, and no voltage spike is detected in STSP converter 550-2 with respect to the positive voltage threshold. In this scenario, the output or PIPS 552 is generated from STSP converter 550-1 as a digital logic zero, and the output or PINS 554 is generated from STSP converter 550-2 as a digital logic one. In yet another scenario, a voltage spike is detected in STSP converter 550-1 with respect to the positive voltage threshold, and a voltage spike is detected in STSP converter 550-2 with respect to the negative voltage threshold. In this scenario, the output or pulse indicating positive spike (PIPS) 552 is generated from STSP converter 550-1 as a digital logic one, and the output or pulse indicating negative spike (PINS) 554 is generated from STSP converter 550-2 as a digital logic one. In yet another scenario, if no voltage spikes occurred in the DUT with respect to the positive and negative voltage spike thresholds, then no voltage spikes are detected by the positive STSP converter 550-1 and no voltage spikes are detected by the negative STSP converter 550-2. Thus, outputs (i.e., PIPS 552 and PINS 554) in this scenario are both zero.

Figure 6:
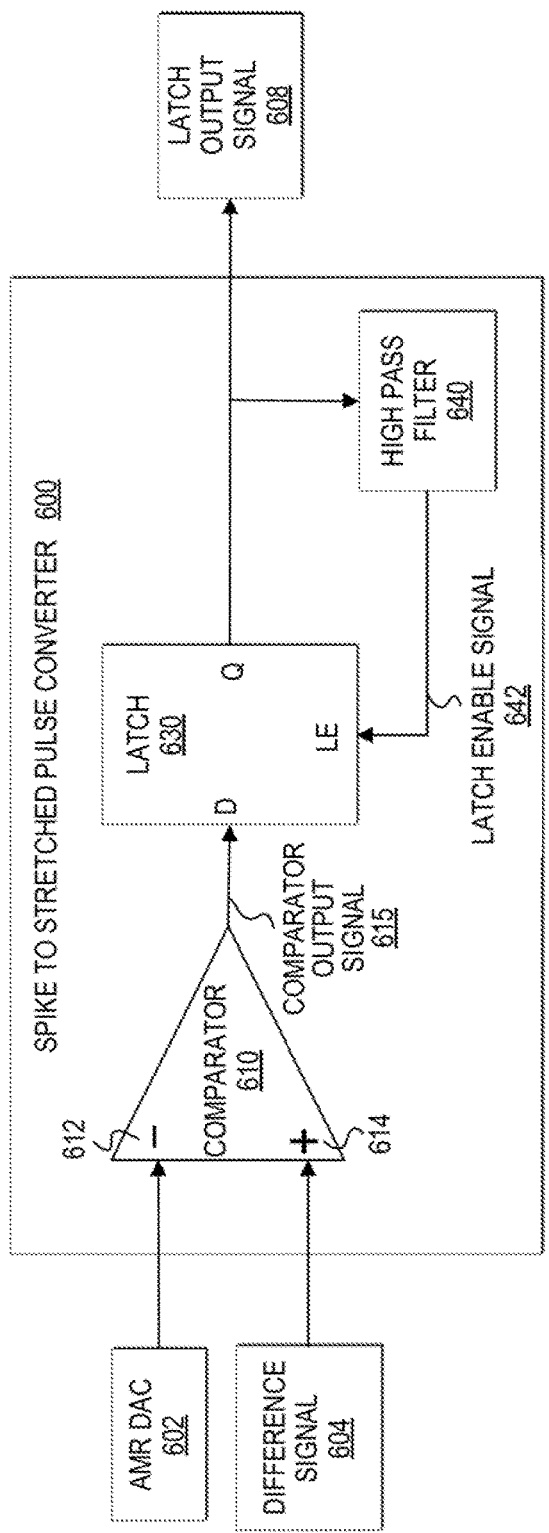
FIG. 6 is a simplified block diagram illustrating yet other example details of selected components of embodiments of the system.

FIG. 6 is a simplified block diagram illustrating example details of a spike to stretched pulse (STSP) converter 600 in an AFE (e.g., 160, 460-1, 460-2, 460-*n*, 500) of a voltage spike detector (e.g., 150, 400). STSP converter 600 is a more detailed illustration of one possible embodiment of STSP converters disclosed herein, such as STSP converter 550-1 and STSP converter 550-2. STSP converter 600 can include a comparator 610, a latch 630, and a high pass filter 640. An AMR digital to analog converter (DAC) 602 is an example of positive AMR DAC 525 or negative AMR DAC 527. AMR DAC 602 provides a positive voltage threshold or a negative voltage threshold to comparator 610 depending on whether the STSP converter 600 is configured to detect positive voltage spikes or negative voltage spikes. A difference analog signal 604 is also provided to comparator 610.

In at least one embodiment, comparator 610 is a high speed comparator, which may be a standard analog integrated circuit that compares two voltages and outputs a digital signal that indicates which one is larger. This digital signal is comparator output signal 615 in FIG. 6. Comparator 610 includes two analog input terminals: a negative (or reference) terminal 612 and a positive terminal 614. Negative terminal 612 receives the voltage threshold. The threshold may be positive or negative depending on how the STSP converter 600 is implemented in an AFE (e.g., STSP converter 550-1 to detect positive voltage spikes, STSP converter 550-2 to detect negative voltage spikes). Positive terminal 614 receives the difference analog signal 604, which is an attenuated signal that represents the difference between voltage levels of a signal from a PUT probe and a signal from a reference probe.

In one embodiment, comparator 610 is a one-bit analog to digital converter as it converts an analog signal (e.g., difference analog signal 604) into a high or low digital pulse, based on whether the difference analog signal 604 is above or below the voltage threshold on the negative terminal 612. Because a voltage spike can be very short (e.g., nanoseconds), if comparator output signal 615 is high, it is converted to a very short pulse that may be undetectable by the digital logic of a controller.

Latch 630 and high pass filter 640 cooperate to stretch the pulse of comparator output signal 615 to a desired width (or window of time) that is detectable and can be processed by digital logic of a controller. Latch 630 is a digital circuit that receives comparator output signal 615 at terminal D, outputs a digital signal as latch output signal 608 at terminal Q, and receives a latch enable signal 642 at terminal LE from high pass filter 640. When a latch enable signal 642 is low, latch 630 acts as a transporter and the comparator output signal 615 that is received at terminal D is transported directly to terminal Q for output. When latch enable signal 642 is high, latch 630 maintains whatever is on the Q terminal. Thus, if latch enable signal 642 is high, then even if comparator output signal 615 changes, the latch output signal at terminal Q remains the same.

High pass filter 640 generally passes signals with a frequency higher than a certain cutoff frequency. It may also attenuate signals with lower than the cutoff frequency. In STSP converter 600, high pass filter 640 receives the digital latch output signal as input, and outputs a digital signal, shown as latch enable signal 642, to terminal LE of latch 630.

In operation, if the latch enable signal 642 is low and the output of the comparator is low, then the high pass filter output remains low, which causes latch 630 to remain enabled and to transfer the digital signal received at terminal D to be output at terminal Q. A transition of the digital signal from low to high at terminal D, however, results in the latch being disabled. Specifically, when comparator output signal 615 goes high (e.g., a short pulse) and is received as input at terminal D of the latch, then the output of the latch at terminal Q goes high, because the latch is simply transferring input at terminal D to its output at terminal Q. The high digital signal that is output from terminal Q is fed into high pass filter 640. Due to the transition on the latch output signal, this high digital signal is received by the high pass filter and is transferred back to the latch as latch enable signal 642 to disable the latch. Thus, the high pass filter disables the latch for a certain period of time. This causes the output at terminal Q to remain high for that period of time even if the input signal at terminal D transitions back to low.

In at least one embodiment, the period for which the latch remains disabled can be lengthened by tuning resistors and/or capacitors of the high pass filter to values that cause the latch to remain disabled for the desired period of time. The latch remains disabled and its output signal remains high for as long as the output of the high pass filter remains high. Thus, the pulse of comparator output signal 615 that is fed into the latch is effectively stretched to a desired width (or window of time) in latch output signal 608. Although the latch output signal remains stable (e.g., a high digital one), the high pass filter output will begin to decay. The speed at which the output decays if there is no transition on the input is the decay rate of the high pass filter. Once the high pass filter output goes below a latch threshold, then the latch enable signal 642 will go low again and the latch will be enabled. Thus, the decay rate and the latch threshold can be used to configure a period of time during which the latch output signal remains high and the pulse of the latch input signal (e.g., comparator output signal 615) is stretched to a desired width in latch output signal 608. Once the latch is enabled, it returns to functioning in its normal mode as a transporter of an input signal (e.g., comparator output signal 615) to an output signal (e.g., latch output signal 608) and waits for another voltage spike to be detected.

Figure 7:
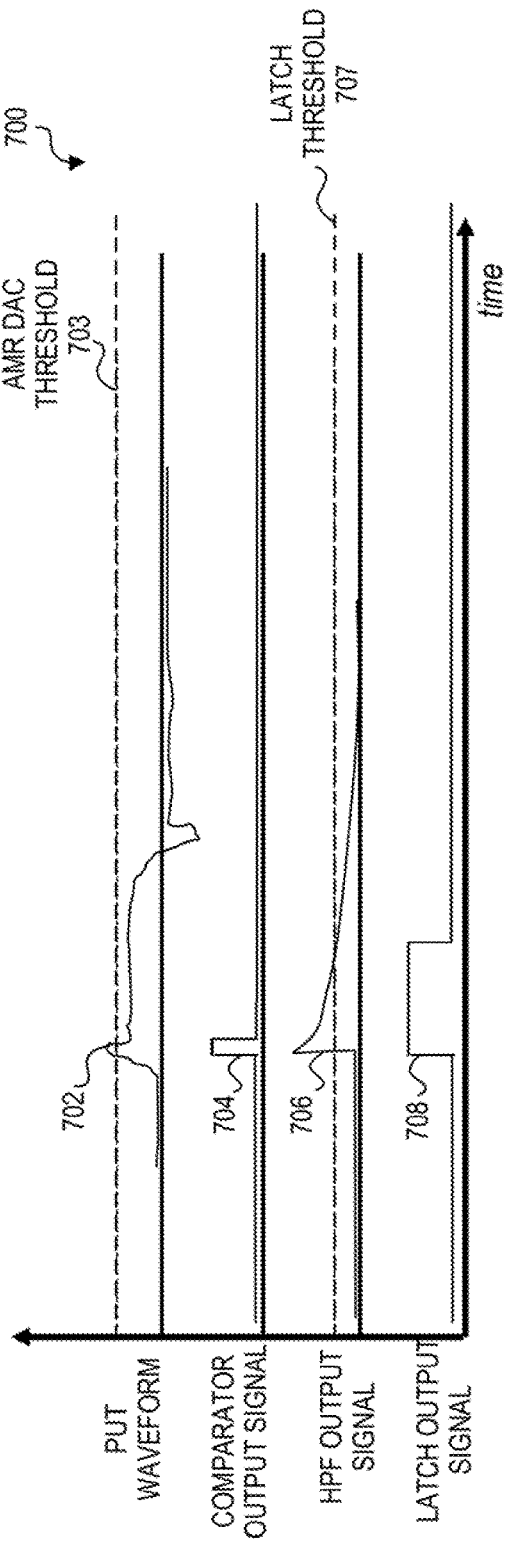
FIG. 7 is a graph illustrating an example waveform of a pin under test and various component outputs corresponding to the waveform in the system.

FIG. 7 illustrates a graph 700 of an example PUT waveform 702 and output signals of components in an STSP converter, such as STSP converter 600, based on PUT waveform 702. PUT waveform 702 indicates a voltage spike above an AMR DAC threshold 703. As previously described herein, a PUT analog signal may be attenuated, buffered, and a difference between the PUT analog signal and a reference analog signal may be generated to produce a difference analog signal (e.g., 604). PUT waveform 702 is an example of at least a portion of a difference analog signal. As shown, the voltage spike that exceeds the AMR DAC threshold 703 is very short.

A comparator output signal 704 is shown with a short pulse corresponding to the voltage spike in PUT waveform 702. A high pass filter (HPF) output signal 706 (or latch enable signal) shows the HPF output signal going high at the low-to-high transition of the comparator output signal 704, and then decaying over time. A latch threshold 707 is provided and the HPF output signal 706 does not fall below the latch threshold 707 until after the comparator output signal transitions back to low. A latch output signal 708 also goes high at the low-to-high transition of comparator output signal 704. While the HPF output signal 706 remains above latch threshold 707, however, latch output signal 708 remains high even when comparator output signal 704 goes low. Accordingly, comparator output signal 704 is transformed by effectively stretching its pulse into an elongated (or stretched) pulse having a desired width in latch output signal 708. The resulting width of this elongated pulse represents a window of time that is larger than a window of time represented by the short pulse of the comparator output signal 704. The resulting width of the elongated pulse is based on the decay rate of the HPF and the latch threshold 707.

Figure 8:
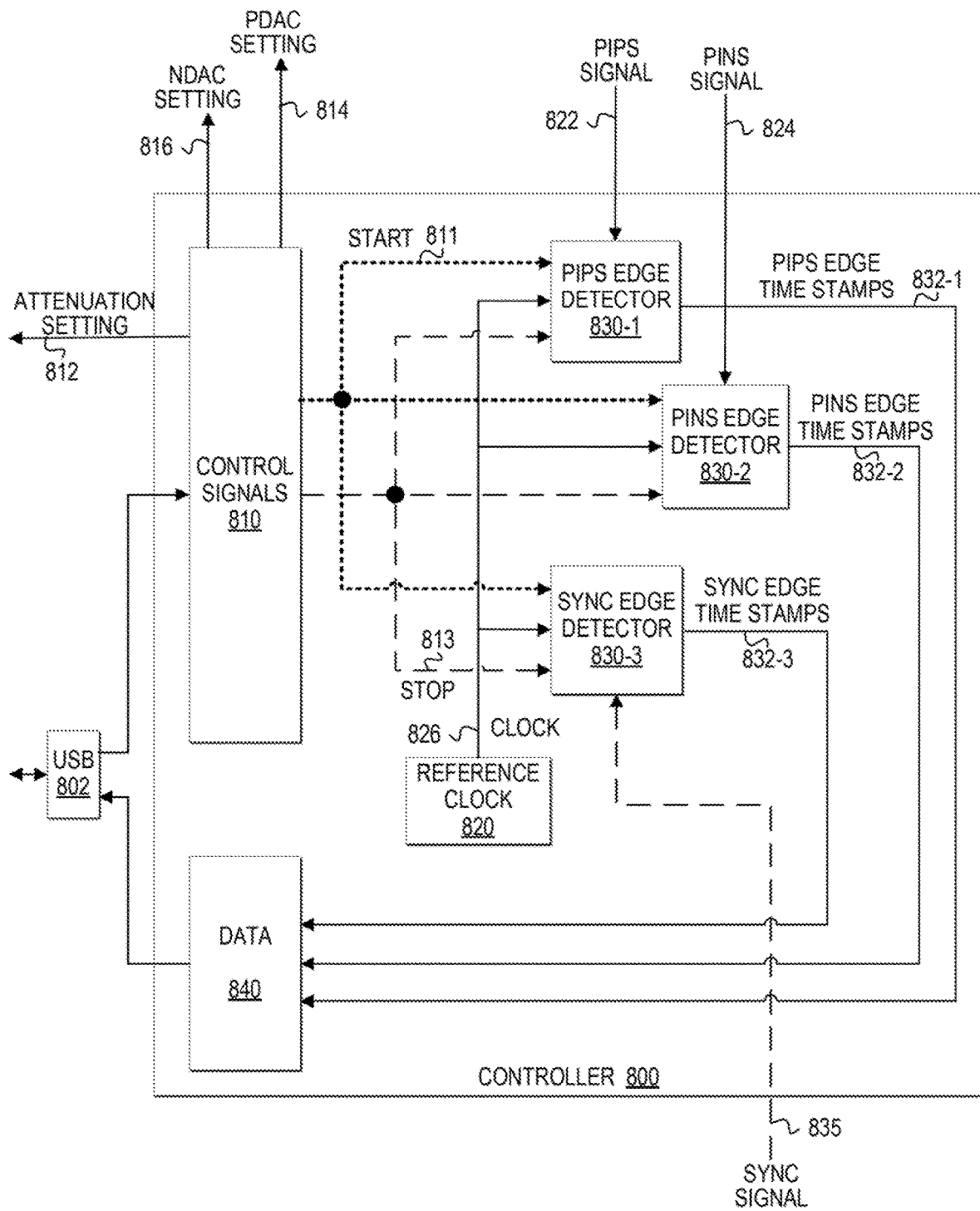
FIG. 8 is a simplified block diagram illustrating yet other example details of selected components of embodiments of the system.

FIG. 8 is a simplified block diagram illustrating example details of a controller 800 in a voltage spike detector (e.g., 150, 400). Controller 800 is a more detailed illustration of one possible embodiment of a controller, such as controllers 170 and 470. Controller 800 can include a reference clock 820, a PIPS edge detector 830-1, a PINS edge detector 830-2, and a sync edge detector 830-3.

In at least one embodiment, a universal serial bus (USB) 802 is provided between controller 800 and a user computer (e.g., 110). Control signals 810 may be sent to controller 800 from the user computer to configure the voltage spike detector for a particular SUV. In one example, control signals 810 include an attenuation setting 812, a PDAC setting 814, and an NDAC setting 816. These configuration settings can be provided by controller 800 to attenuators (e.g., 510-1 and 510-2) and STSP converters (e.g., 550-1, 550-2, 600) in the voltage spike detector. Control signals 810 received over USB 802 may also include a START command 811, which is used to start PIPS edge detector 830-1, PINS edge detector 830-2, and SYNC edge detector 830-3. Control signals 810 received over USB 802 may further include a STOP command 813, which is used to stop PIPS edge detector 830-1, PINS edge detector 830-2, and SYNC edge detector 830-3 after a test flow has completed. In at least one embodiment, control signals 810 received by a user computer include a capture time period indicating how long the voltage spike detector is to capture voltage spikes while the SUV is running. Controller 800 may then keep track of the time and issue STOP command 813 when the capture time period expires.

A PIPS signal 822 and a PINS signal 824 are received by PIPS edge detector 830-1 and PINS edge detector 830-2, respectively. A sync signal 835 is received by sync edge detector 830-3. In at least one embodiment, each of these signals is a digital signal and therefore, low frequency. The PINS and PIPS signals are produced by STSP converters in an AFE and the sync signal is produced by the SUV when it is running a test program to perform a test on the DUT.

Reference clock 820 is used to run the voltage spike detector using a clock signal 826. Input into the edge detectors include digital signals (e.g., digital logic ones and zeros). PIPS and PINS signals may have pulses when a voltage spike is detected. Sync signal 835 has at least one pulse when an SUV is running. In at least one embodiment, the time corresponding to the edge of a pulse (e.g., in a PIPS signal, PINS signal, or sync signal) is detected by the appropriate edge detector (e.g., 830-1, 830-2, and 830-3).

In at least one embodiment, the output of each edge detector can be a series of time stamps. Each of the edge detectors 830-1, 830-2, and 830-3 may generate time stamps with information specific to their particular input signals. PIPS edge detector 830-1 can generate PIPS edge time stamps 832-1 indicating when the PIPS signal 822 transitioned to high or low. PINS edge detector 830-2 can generate PINS edge time stamps 832-2 indicating when the PINS signal 824 transitioned to high or low. Sync edge detector 830-3 can generate sync edge time stamps 832-3 indicating when the sync signal 835 transitioned to high or low. Arrays of the time stamps may be formed in data 840. In at least one embodiment, an array may include time stamps indicating when a particular signal transitioned to high and when the particular signal transitioned to low. For example, the timing of positive voltage spikes is indicated in one array of time stamps, the timing of negative voltage spikes is indicated in another array of time stamps, and the timing of sync signals received by the voltage spike detector from the SUV is indicated in yet another array of time stamps.

The arrays of time stamps can be provided to the user computer via USB 802. This information can be analyzed, and appropriate actions can be taken (e.g., adjust sync signal commands in the code of the test program, modify the code of the test program to correct voltage spikes, attach PUT probe to the next pin to be tested, rerun the test program, etc.).

Figure 9:
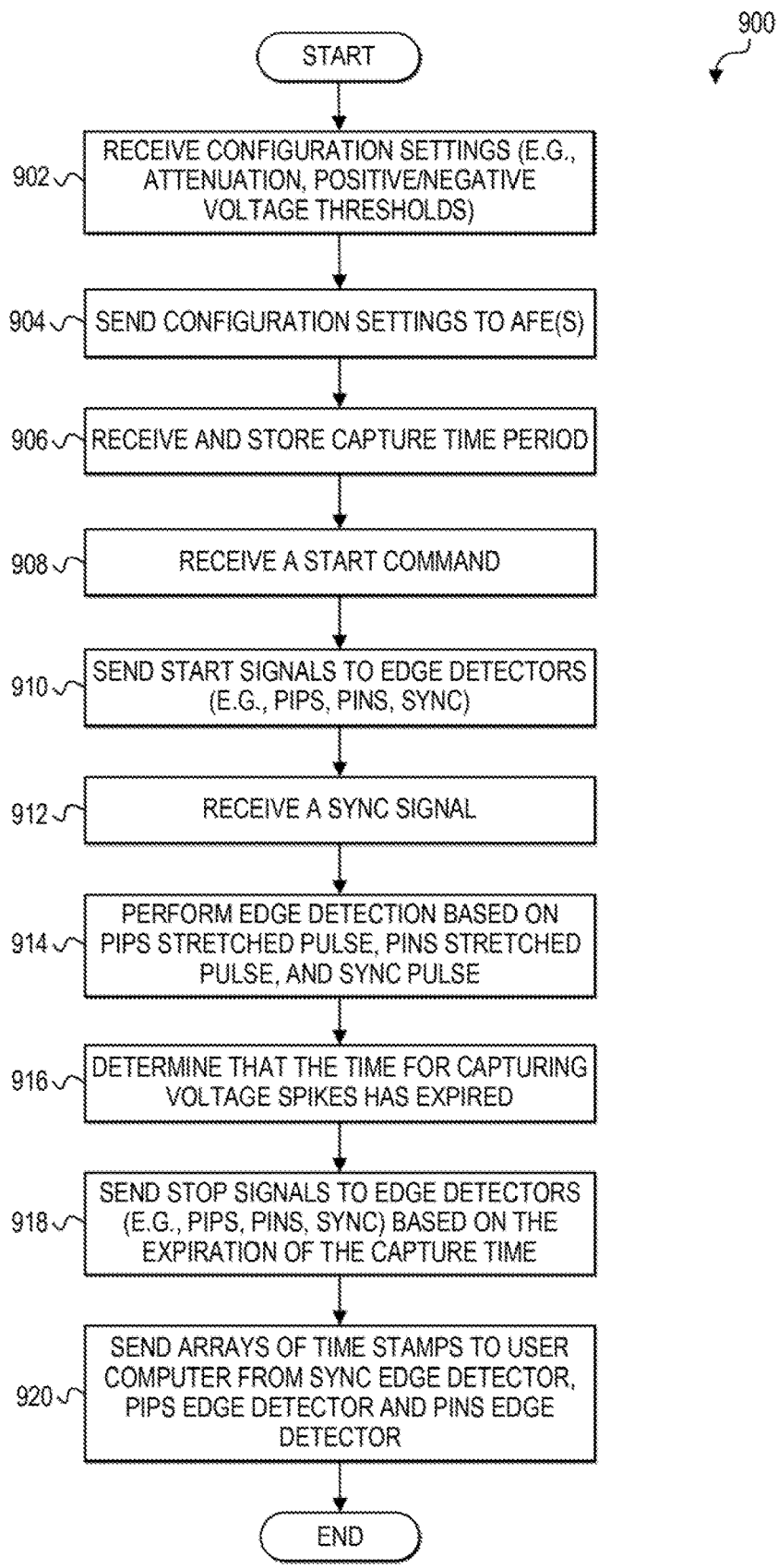
FIG. 9 is a simplified flowchart illustrating example operations that may be associated with at least one embodiment of the system.

Turning to FIG. 9, FIG. 9 is a simplified flowchart 900 illustrating example operations that may be associated with embodiments of system 100. One or more of the operations may be performed by a controller (e.g., 170, 270, 800) in a voltage spike detector (e.g., 150, 400) of system 100.

At 902, a controller in a voltage spike detector receives configuration settings for the voltage spike detector from a user computer (e.g., 110). The configuration settings can include attenuation settings, a positive voltage threshold setting, and a negative voltage threshold setting. At 904, the configuration settings can be sent to one or more AFEs in the voltage spike detector. For example, the positive voltage threshold setting can be sent to a positive AMR DAC in each AFE, the negative voltage threshold setting can be sent to a negative AMR DAC in each AFE, and the attenuation settings can be sent to attenuators in each AFE.

At 906, the controller can receive and store a capture time period from the user computer. The capture time period specifies the an amount of time during which the voltage spike detector is to capture voltage signals (including voltage spikes) from a PUT, where the period begins upon the voltage spike detector receiving a first sync signal from an SUV that is performing a test on a device under test. The capture time period may be at least as long as the test flow of the SUV. In at least some embodiments, the capture time period may be as long as the test flow of the SUV plus a small margin of time to ensure that all voltage spikes that occur during the test flow are captured.

At 908, the controller can receive a START command from the user computer. The START command is an instruction to initiate edge detectors to identify edges in PIPS and PINS signals that indicate voltage spikes and to identify edges in sync signals that indicate time references. At 910, the START command is propagated to edge detectors (e.g., 830-1, 830-2, 830-3) for PIPS signals, PINS signals, and sync signals.

At 912, a sync signal is received from an SUV. At 914, edge detection is performed based on a PIPS signal and an array of time stamps is created that indicates the time that each positive voltage spike (e.g., each stretched pulse) occurred. Edge detection is performed based on a PINS signal and an array of time stamps is created that indicates the time that each negative voltage spike (e.g., stretched pulse) occurred. It should be noted that if positive voltage spikes occur in a signal for a particular test flow, then negative voltage spikes will not occur at the same time as the positive voltage spikes but may occur at other times during the same test flow. Edge detection is also performed based on one or more sync signals and an array of time stamps is created that indicates the time that each sync signal was received during the test flow.

At 916, a determination is made that the capture time period for capturing voltage spikes during a test flow has expired. At 918, a STOP command is sent to edge detectors for PIPS signals, PINS signals, and sync signals based on the expiration of the capture time period.

At 920, the array of time stamps generated by the sync edge detector is sent to the user computer. In addition, if any positive voltage spikes were detected, the array of time stamps generated by the PIPS edge detector is sent the user computer. Also, if any negative voltage spikes were detected, the array of time stamps generated by the PINS edge detector is sent to the user computer.

Figure 10:
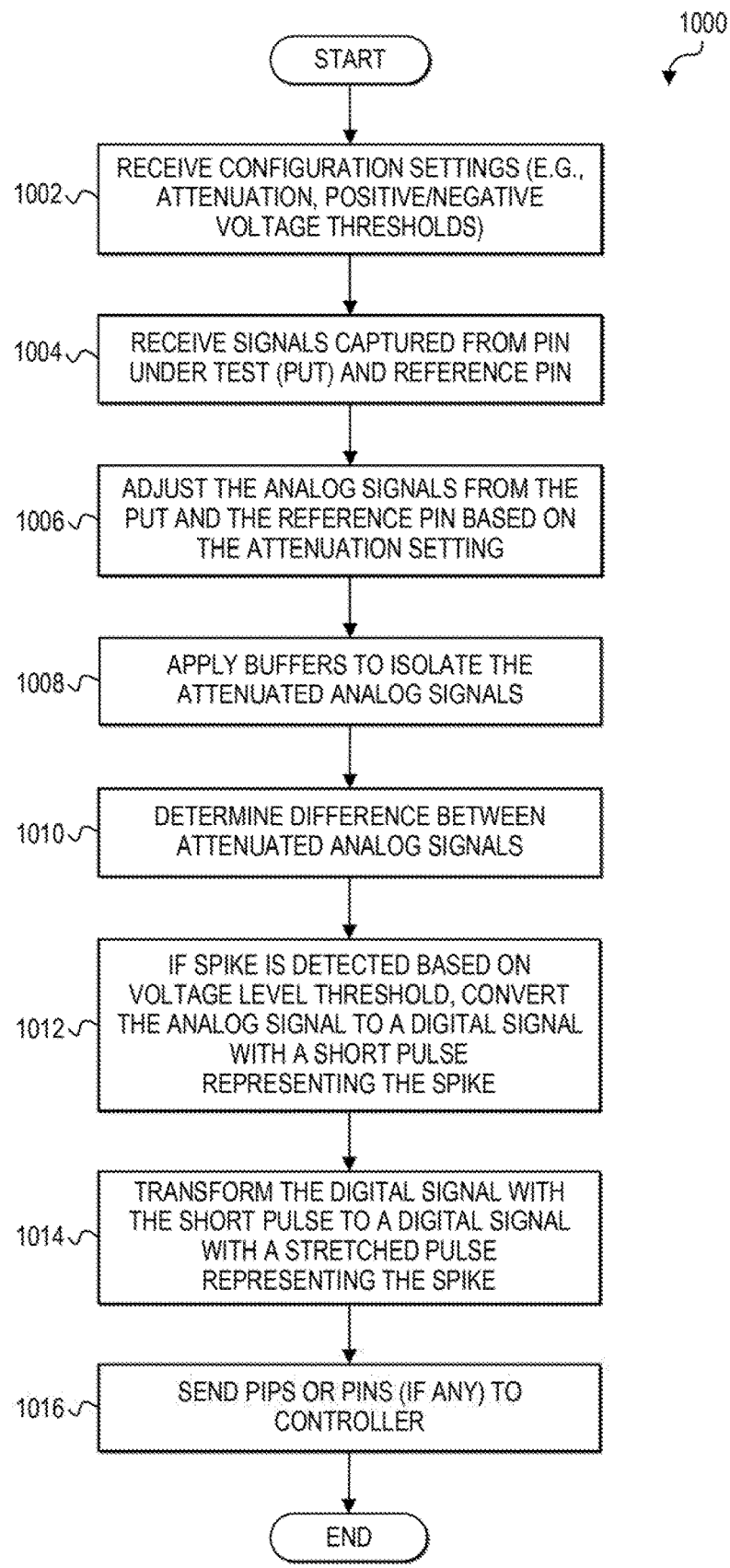
FIG. 10 is a simplified flowchart illustrating example operations that may be associated with at least one embodiment of the system.

FIG. 10 is a simplified flowchart 1000 illustrating example operations that may be associated with embodiments of system 100. One or more of the operations may be performed by an analog front end (AFE) (e.g., 160, 460-1, 460-2, 460-n, 500) in a voltage spike detector (e.g., 150, 400) of system 100.

At 1002, an AFE receives configuration settings from a controller in the voltage spike detector. The configuration settings can include attenuation settings, a positive voltage threshold setting, and a negative voltage threshold setting. The attenuation settings may be used to program one or more attenuators in the AFE. The positive voltage threshold setting may be converted to an analog signal (e.g., at 525) and provided to a spike to stretched pulse (STSP) converter (e.g., 550-1, 600) for detecting positive voltage spikes. The negative voltage threshold setting may be converted to an analog signal (e.g., at 527) and provided to a spike to stretched pulse (STSP) converter (e.g., 550-2, 600) for detecting negative voltage spikes.

At 1004, the AFE receives analog signals from a pin under test (PUT) and a reference pin on the device under test (DUT). At 1006, the analog signals from the PUT and the reference pin may be adjusted based on the attenuation setting. For example, the voltage level of the PUT and the reference pin may be reduced to be in a range capable of being handled by electronic components in the voltage spike detector.

At 1008, buffers may be used to isolate the attenuated analog signals. At 1010, the difference between the attenuated analog signals from the PUT and the reference pin is determined, and a difference analog signal (e.g., 542, 604) representing the difference is generated.

At 1012, the difference analog signal is fed into a positive STSP converter for detecting positive voltage spikes and into a negative STSP converter for detecting negative voltage spikes. If a spike is detected in the difference analog signal by the positive STSP converter based on a positive voltage threshold, then the positive STSP converter converts the difference analog signal to a digital signal with a short pulse representing the positive spike. If a spike is detected in the difference analog signal by the negative STSP converter based on a negative voltage threshold, then the negative STSP converter converts the difference analog signal to a digital signal with a short pulse representing the negative spike.

At 1014, the positive STSP converter transforms a digital signal with a short pulse representing a positive spike into a digital signal with a stretched pulse representing the positive spike (PIPS). The negative STSP converter transforms a digital signal with a short pulse indicating a negative spike into a digital signal with a stretched pulse representing the negative spike (PINS). At 1016, the PIPS and/or PINS signal, if any, is provided to the controller.

Figure 11A:
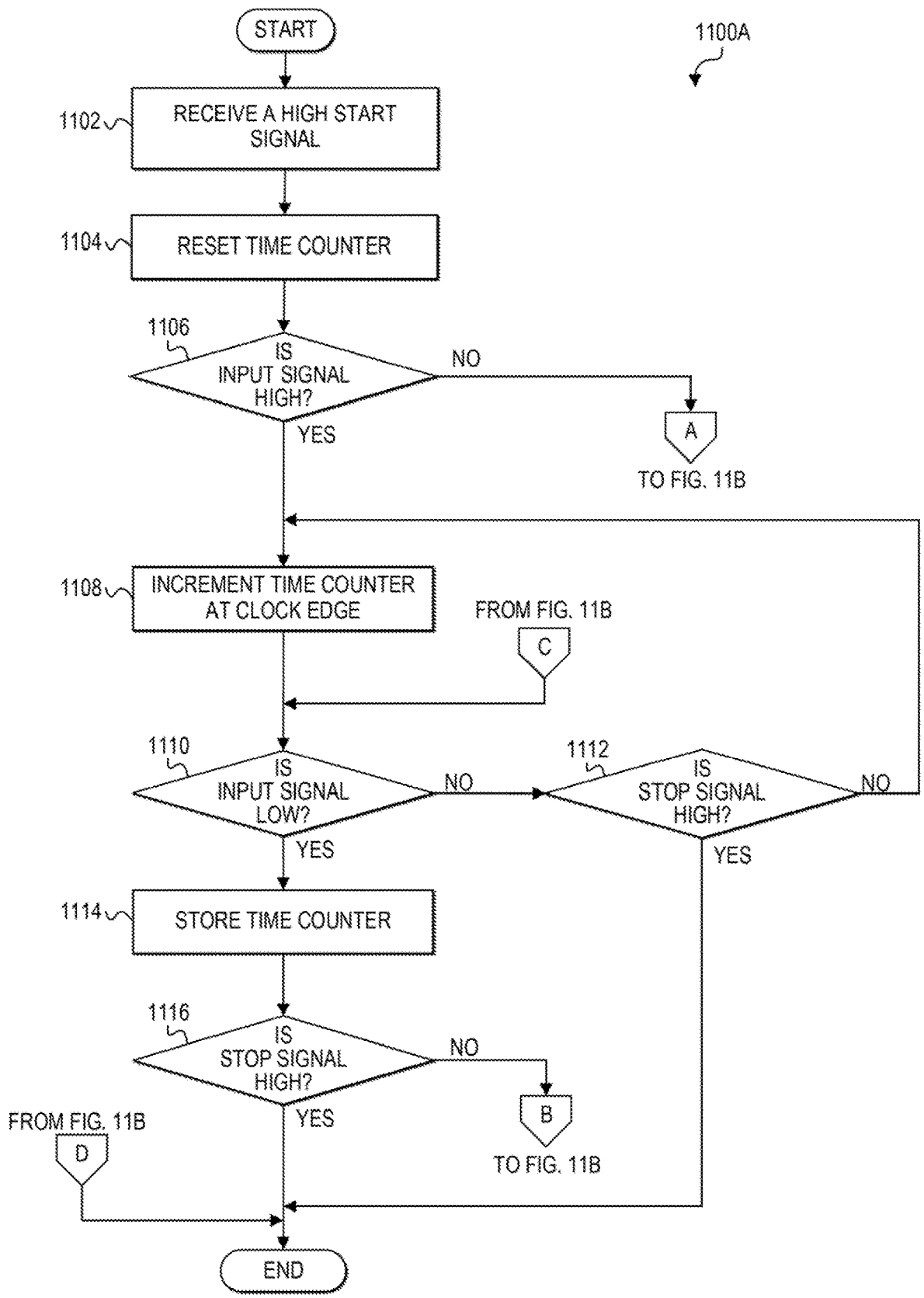
FIGS. 11A and 11B are simplified flowcharts illustrating other example operations that may be associated with at least one embodiment of the system.
Figure 11B:
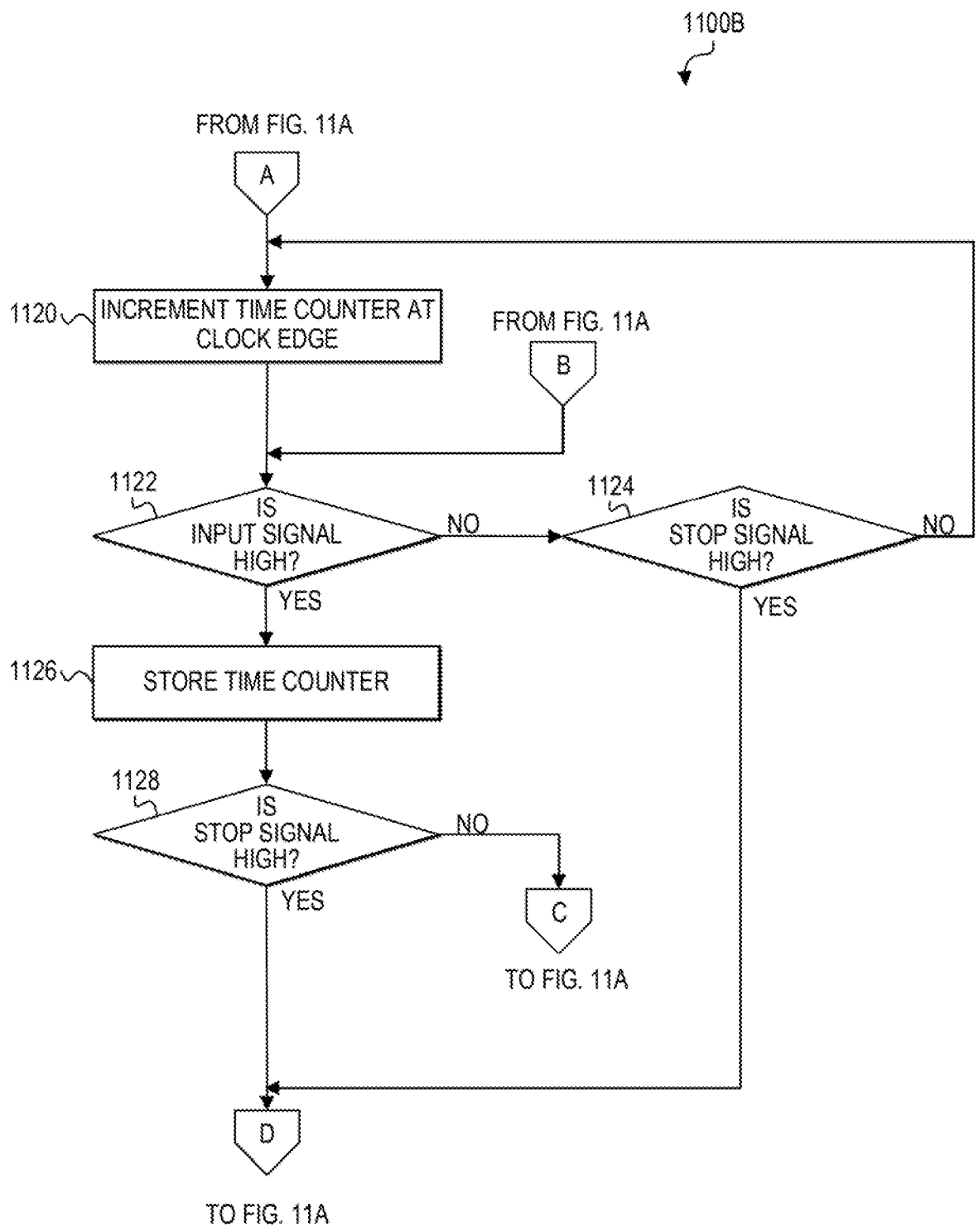

FIGS. 11A-11B are simplified flowcharts 1100A and 1100B illustrating example operations that may be associated with embodiments of system 100. One or more of the operations may be performed by an edge detector using digital logic in a controller (e.g., 170, 470, 800) of a voltage spike detector (e.g., 150, 400) of system 100 to detect stretched (or elongated) pulses representing voltage spikes. For example, the one or more operations may be performed in PIPS edge detector 830-1 to detect the transitions in a PIPS signal. The one or more operations may be performed in PINS edge detector 830-2 to detect transitions in a PINS signal. The one or more operations may be performed in a sync edge detector 830-3 to detect transitions in a sync signal.

At 1102, in flowchart 1100A, a high START signal is received. At 1104, a time counter may be reset. At 1106, a determination is made as to whether an input signal (e.g., PIPS signal, PINS signal, or SYNC signal) for the particular edge detector is high. If the input signal is high, then at 1108, the time counter is incremented at the clock edge. At 1110, a determination is made as to whether the input signal is low. If the input signal is not low, then at 1112, a determination is made as to whether the STOP signal is high. If the STOP signal is high, then flow ends. If the STOP signal is not high, then flow continues at 1108, where the time counter is incremented at the clock edge. The time counter can continue to be incremented in this loop at 1108 until the high input signal transitions to a low input signal.

If the input signal is determined to be low at 1110, then at 1114, the time counter is stored. The time counter can be a value indicating the time relative to the time reference provided by a sync signal, such as the first sync signal received during a test flow. At 1116, a determination is made as to whether the STOP signal is high. If the STOP signal is high, then flow ends. If the STOP signal is not high, then flow continues at 1122 in flowchart 1100B.

At 1122, a determination is made as to whether the input signal is high. If the input signal is not high, then at 1124, a determination is made as to whether the STOP signal is high. If the STOP signal is high, then flow ends. If the STOP signal is not high, then flow continues at 1120, where the time counter is incremented at the clock edge. The time counter can continue to be incremented in this loop at 1120 until the low input signal transitions to a high input signal.

If the input signal is determined to be high at 1122, then at 1126, the time counter is stored. At 1128, a determination is made as to whether the STOP signal is high. If the STOP signal is high, then flow ends. If the STOP signal is not high, then flow continues at 1110 in flowchart 1100A, as previously described herein.

With reference again to 1106 in flowchart 1100A, if a determination is made that the input signal is not high, then flow continues at 1120 in flowchart 1100B. At 1120, the time counter is incremented at the clock edge. At 1122, a determination is made as to whether the input signal is high. If the input signal is not high, then at 1124, a determination is made as to whether the STOP signal is high. If the STOP signal is high, then flow ends. If the STOP signal is not high, then flow continues at 1120, where the time counter is incremented at the clock edge. The time counter can continue to be incremented in this loop at 1120 until the low input signal transitions to a high input signal.

If the input signal is determined to be high at 1122, then at 1126, the time counter is stored. At 1128, a determination is made as to whether the STOP signal is high. If the STOP signal is high, then flow ends. If the STOP signal is not high, then flow continues at 1110 in flowchart 1100A, as previously described herein.

Figure 12:
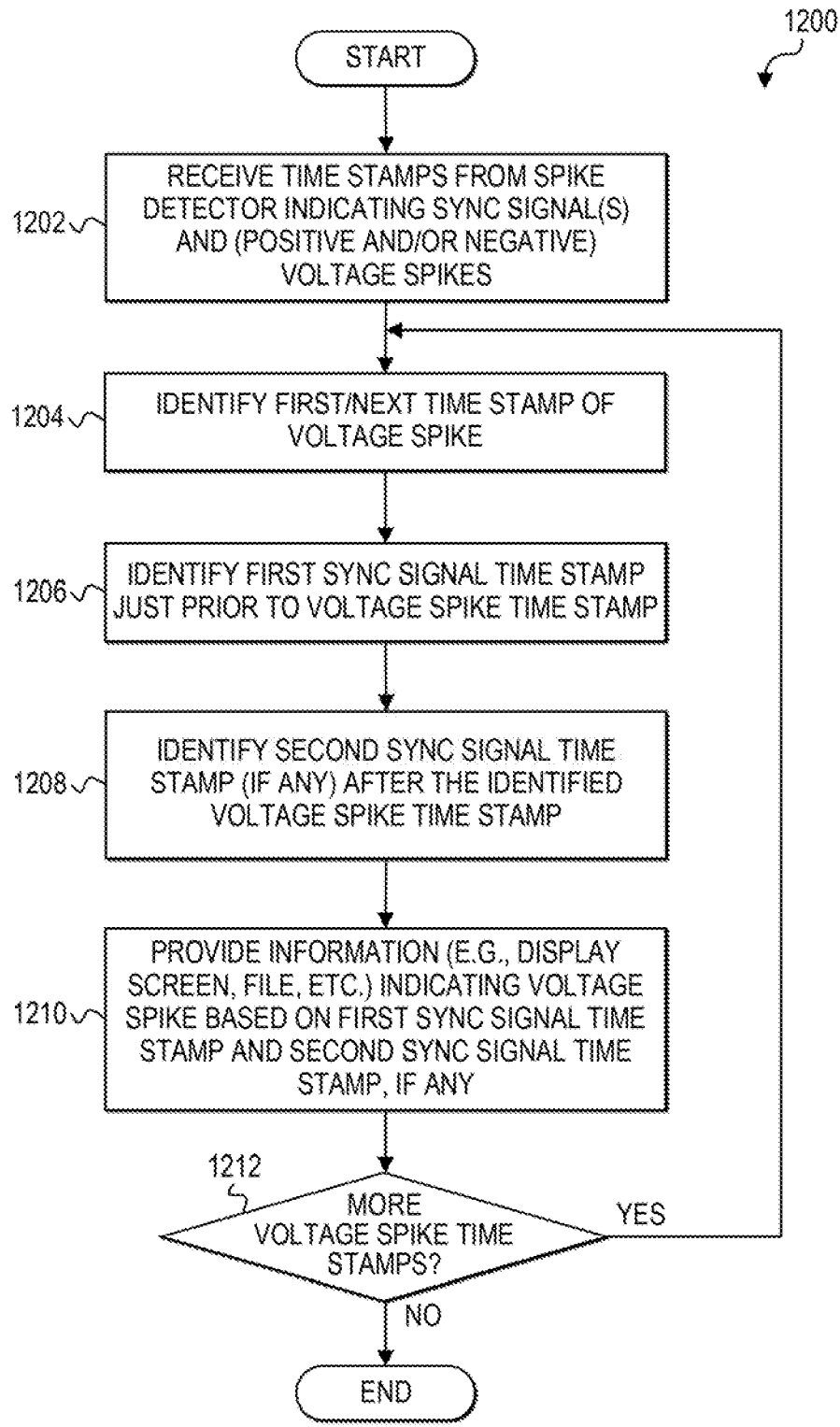
FIG. 12 is a simplified flowchart illustrating yet other example operations that may be associated with at least one embodiment of the system.

Turning to FIG. 12, FIG. 12 is a simplified flowchart 1200 illustrating example operations that may be associated with embodiments of system 100. One or more of the operations may be performed by a spike detector application (e.g., 114) of a user computer (e.g., 110) in system 100.

At 1202, the user computer receives arrays of time stamps from the voltage spike detector in system 100 generated for one test flow of a test performed by an SUV on a pin of a device under test. A first array of time stamps may specify times that one or more positive voltage spikes were detected during the test flow. A second array of time stamps may specify times that one or more negative voltage spikes were detected during the test flow. A third array may specify times that one or more sync signals were received by the voltage spike detector from the SUV during the test flow.

At 1204, a first time stamp of a voltage spike (in array of time stamps for positive voltage spikes or negative voltage spikes) is identified. At 1206, a first sync signal time stamp just prior to (or the same time as) the voltage spike time stamp is identified.

At 1208, if the array of time stamps for sync signals includes a second sync signal time stamp that is later than the first time stamp of the identified voltage spike, then the second sync signal time stamp is identified. At 1210, information is provided to a user indicating that the identified voltage spike occurred within a certain time frame of the test flow based on the first sync signal time stamp and the second sync signal time stamp, if any. The information may be provided in any suitable manner including, but not limited to, a graphical user interface, a report, or a file.

At 1212, a determination is made as to whether more voltage spike time stamps were received. If more voltage spike time stamps were received, then flow returns to 1204, where the time stamp of the next voltage spike is identified. Flow continues as previously described until a determination is made as 1212 that no more voltage spike time stamps were received.

Once the user is presented with information indicating the timing of one or more voltage spikes during the test flow, a user may determine whether to rerun the test program of the SUV with modified sync signals, attempt to modify the test program of the SUV to eliminate the voltage spikes, or whether to test the next pin.

Note that in this specification, unless expressly stated to the contrary, use of the phrase 'at least one of' refers to any combination of the named elements, conditions, items, operations, or activities. For example, 'at least one of X, Y, and Z' is intended to mean any of the following: 1) at least one X, but not Y and not Z; 2) at least one Y, but not X and not Z; 3) at least one Z, but not X and not Y; 4) at least one X and at least one Y, but not Z; 5) at least one X and at least one Z, but not Y; 6) at least one Y and at least one Z, but not X; or 7) at least one X, at least one Y, and at least one Z. Also, references in the specification to "one embodiment," "an embodiment," "some embodiments," etc., indicate that the embodiment(s) described may include a particular feature, structure, element, or characteristic, but every embodiment may or may not necessarily include that particular feature, structure, element, or characteristic. Moreover, such phrases are not necessarily referring to the same embodiment.

Additionally, the designations of 'first', 'second', 'third', etc., are intended to distinguish the particular items (e.g., element, condition, module, activity, operation, claim element, etc.) they modify, but are not intended to indicate any type of order, rank, importance, temporal sequence, or hierarchy of the modified item. Unless expressly stated to the contrary, such designations are arbitrary and have been used for purposes of clarification only. For example, 'first X' and 'second X' are intended to designate two separate X elements that are not necessarily limited by any order, rank, importance, temporal sequence, or hierarchy of the two elements.

In example implementations, at least some portions of the activities outlined herein may be implemented in software. In some embodiments, one or more of these features may be implemented in hardware, provided external to these elements, or consolidated in any appropriate manner to achieve the intended functionality. The various components may include software (or reciprocating software) that can coordinate in order to achieve the operations as outlined herein. In still other embodiments, these elements may include any suitable algorithms, hardware, firmware, software, components, modules, interfaces, or objects that facilitate the operations thereof.

Furthermore, the apparatuses, computing devices, and systems described and shown herein (and/or their associated structures) may also include suitable interfaces for receiving, transmitting, and/or otherwise communicating data or information in a network environment. Additionally, some of the processors and memory elements associated with the various nodes may be removed, or otherwise consolidated such that a single processor and a single memory element are responsible for certain activities. In a general sense, at least some of the arrangements depicted in the FIGURES may be more logical in their representations, whereas a physical architecture may include various permutations, combinations, and/or hybrids of these elements. It is imperative to note that other possible design configurations may be used to achieve the operational objectives outlined here. Accordingly, the associated infrastructure has a myriad of substitute arrangements, design choices, device possibilities, hardware configurations, software implementations, equipment options, etc.

In some of examples herein, one or more memory elements (e.g., memory elements 118, 138, 478) can store data used for the operations described herein. This includes the memory element being able to store instructions (e.g., software, logic, code, programs, etc.) in transitory or non-transitory computer readable media, such that the instructions are executed to carry out the activities described in this specification. A processor (e.g., processors 116, 136, 476) can execute any type of instructions associated with the data to achieve the operations detailed herein in this specification. In one example, processors could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., a field programmable gate array (FPGA), an erasable programmable read only memory (EPROM), an electrically erasable programmable read only memory (EEPROM)), an ASIC that includes digital logic, software, code, electronic instructions, flash memory, optical disks, CD-ROMs, DVD ROMs, magnetic or optical cards, other types of machine-readable mediums suitable for storing electronic instructions, or any suitable combination thereof.

These devices may further keep information in any suitable type of non-transitory storage medium (e.g., random access memory (RAM), read only memory (ROM), field programmable gate array (FPGA), erasable programmable read only memory (EPROM), electrically erasable programmable ROM (EEPROM), etc.), software, hardware, or in any other suitable component, device, element, or object where appropriate and based on particular needs. The information being captured, sent, received, compared, detected, generated, or stored in the system could be provided in any array, database, register, table, cache, queue, or storage structure, based on particular needs and implementations, all of which could be referenced in any suitable timeframe. Any of the memory items discussed herein should be construed as being encompassed within the broad term 'memory element.' Similarly, any of the potential processing elements, modules, and machines described in this specification should be construed as being encompassed within the broad term 'processor.'

It is also important to note that the operations and steps described with reference to the preceding FIGURES illustrate only some of the possible scenarios that may be executed by, or within, the system. Some of these operations may be deleted or removed where appropriate, or these operations may be modified or changed considerably without departing from the scope of the discussed concepts. In addition, the timing of these operations may be altered considerably and still achieve the results taught in this disclosure. The preceding operational flows have been offered for purposes of example and discussion. Substantial flexibility is provided by the system in that any suitable arrangements, chronologies, configurations, and timing mechanisms may be provided without departing from the teachings of the discussed concepts.

Numerous other changes, substitutions, variations, alterations, and modifications may be apparent to one skilled in the art. Accordingly, the present disclosure is intended to encompass all such changes, substitutions, variations, alterations, and modifications as falling within the scope of the appended claims.

What is claimed is:

1. A method comprising:
   detecting a voltage spike in a first analog signal from a semiconductor device based on a comparison of the first analog signal and a first voltage threshold; and
   converting the first analog signal to a digital signal with a first pulse representing the voltage spike; and
   transforming the first pulse to a stretched pulse defining a greater width than the first pulse.

2. The method of claim 1, wherein the transforming the first pulse to the stretched pulse includes stretching the first pulse to the greater width by maintaining the first pulse at a high signal level for a configured time period.

3. The method of claim 2, wherein the configured time period is based on a decay rate of a high pass filter and a second voltage threshold.

4. The method of claim 1, wherein the first voltage threshold is one of a positive voltage or a negative voltage.

5. The method of claim 1, further comprising:
   generating location information for one or more stretched pulses in the digital signal, wherein the location information indicates respective locations in the digital signal corresponding to the one or more stretched pulses.

6. The method of claim 5, wherein the location information includes a first array of time stamps, each time stamp in the first array of time stamps representing one of the respective locations in the digital signal.

7. The method of claim 6, the method further comprising:
   receiving one or more synchronization signals from a test system coupled to the semiconductor device, the one or more synchronization signals representing a time reference for one or more operations being performed by the test system on the semiconductor device; and
   generating a second array of time stamps, each time stamp in the second array of time stamps corresponding to a respective synchronization signal of the one or more synchronization signals.

8. The method of claim 7, further comprising:
   comparing the first array of time stamps to the second array of time stamps to generate information indicating a segment of the one or more operations that corresponds to the voltage spike.

9. The method of claim 1, further comprising:
   receiving a second analog signal from a first pin on the semiconductor device during a capture time period;
   receiving a reference analog signal from a reference pin on the semiconductor device during the capture time period; and
   prior to detecting the voltage spike, generating the first analog signal by computing a difference between the second analog signal and the reference analog signal.

10. A system comprising:
    a voltage spike detector to:
       detect a voltage spike in a first analog signal received from a semiconductor device; and
       convert the first analog signal to a digital signal, including:
          generating a first pulse corresponding to the voltage spike; and
          transforming the first pulse into a stretched pulse having a desired width.

11. The system of claim 10, wherein the transforming the first pulse into the stretched pulse includes stretching the first pulse to the desired width by maintaining the first pulse at a high signal level for a configured time period.

12. The system of claim 11, wherein the configured time period is based on a decay rate of a high pass filter and a voltage threshold.

13. The system of claim 10, wherein the voltage spike detector is further to:
    receive one or more synchronization signals from a test system coupled to the semiconductor device, the one or more synchronization signals representing a time reference for one or more operations to be performed by the test system on the semiconductor device.

14. The system of claim 13, wherein the voltage spike detector is further to:
    generate a first array of time stamps, each time stamp in the first array of time stamps corresponding to a respective stretched pulse in the digital signal;
    generate a second array of time stamps, each time stamp in the second array of time stamps corresponding to a respective synchronization signal of the one or more synchronization signals; and
    send the first array of time stamps and the second array of time stamps to a computing device.

15. The system of claim 14, further comprising:
    a non-transitory computer readable media including instructions for execution, which when executed by a processor are to:
       generate information indicating a segment of the one or more operations that corresponds to the voltage spike, wherein the information is generated based at least in part on a comparison of the first array of time stamps to the second array of time stamps.

16. The system of claim 15, wherein the instructions, when executed by the processor, are further to:
    identify a first time stamp in the first array of time stamps corresponding to the voltage spike;
    identify a second time stamp in the second array of time stamps that immediately precedes the first time stamp and corresponds to a first synchronization signal;
    identify a third time stamp in the second array of time stamps that immediately succeeds the first time stamp and corresponds to a second synchronization signal; and
    identify the segment of the one or more operations that corresponds to the voltage spike based on the first synchronization signal and the second synchronization signal.

17. An apparatus comprising:
    an analog front end to:
       detect one or more voltage spikes in an analog signal, wherein the analog signal is obtained from a semiconductor device over a duration of a test program performing a test on the semiconductor device; and
       convert the analog signal to a digital signal with one or more first pulses representing the one or more voltage spikes, respectively; and
    a controller coupled to the analog front end, the controller to:
       generate location information of the one or more first pulses in the digital signal, wherein the location information is to include a first array of time stamps, the time stamps in the first array of time stamps corresponding to one or more stretched pulses in the digital signal.

18. The apparatus of claim 17, wherein the analog front end is further to:
   transform the one or more first pulses to the one or more stretched pulses, wherein the one or more stretched pulses each defines a greater width than a corresponding first pulse; and
   detect the one or more stretched pulses, wherein the location information is generated based on detecting the one or more stretched pulses.

19. The apparatus of claim 18, wherein transforming the one or more first pulses to the one or more stretched pulses is to include stretching the one or more first pulses to the greater width by maintaining the one or more first pulses at a high signal level for a configured time period.

20. The apparatus of claim 17, wherein the controller is further to:
   receive one or more synchronization signals from a test system coupled to the semiconductor device, the one or more synchronization signals representing time references for one or more operations being performed by the test system on the semiconductor device;
   generate a second array of time stamps, each time stamp in the second array of time stamps corresponding to a respective synchronization signal of the one or more synchronization signals; and
   send the first array of time stamps and the second array of time stamps to a computing device.

* * * * *